United States Patent
Elliott et al.

(10) Patent No.: US 7,984,543 B2
(45) Date of Patent: Jul. 26, 2011

(54) METHODS FOR MOVING A SUBSTRATE CARRIER

(75) Inventors: Martin R. Elliott, Pepperell, MA (US); Vinay K. Shah, San Mateo, CA (US); Eric A. Englhardt, Palo Alto, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 12/359,310

(22) Filed: Jan. 24, 2009

(65) Prior Publication Data

US 2009/0188103 A1    Jul. 30, 2009

Related U.S. Application Data

(60) Provisional application No. 61/023,819, filed on Jan. 25, 2008.

(51) Int. Cl.
*B23P 23/00* (2006.01)

(52) U.S. Cl. ..... 29/564.1; 29/564; 29/592.1; 198/346.2; 414/217

(58) Field of Classification Search ............. 29/592.1, 29/564, 564.1; 198/346.2; 414/217, 222
See application file for complete search history.

(56) References Cited

U.S. PATENT DOCUMENTS

| | | | |
|---|---|---|---|
| 4,981,408 A * | 1/1991 | Hughes et al. | 414/217 |
| 6,506,009 B1 | 1/2003 | Nulman et al. | |
| 6,955,517 B2 | 10/2005 | Nulman et al. | |
| 7,168,553 B2 | 1/2007 | Rice et al. | |
| 7,230,702 B2 | 6/2007 | Rice et al. | |
| 7,234,908 B2 | 6/2007 | Nulman et al. | |
| 7,243,003 B2 | 7/2007 | Elliott et al. | |
| 7,346,431 B2 | 3/2008 | Elliott et al. | |
| 7,359,767 B2 | 4/2008 | Elliott et al. | |
| 7,360,981 B2 | 4/2008 | Weaver | |
| 7,409,263 B2 | 8/2008 | Elliott et al. | |
| 7,433,756 B2 | 10/2008 | Rice et al. | |
| 7,506,746 B2 * | 3/2009 | Rice et al. | 198/465.1 |
| 7,527,141 B2 * | 5/2009 | Rice et al. | 198/464.4 |
| 7,575,406 B2 * | 8/2009 | Hofmeister et al. | 414/217 |
| 7,673,735 B2 * | 3/2010 | Rice et al. | 198/464.4 |
| 2002/0090282 A1 | 7/2002 | Bachrach | |
| 2003/0031538 A1 | 2/2003 | Weaver | |
| 2003/0110649 A1 | 6/2003 | Hudgens | |
| 2003/0202865 A1 | 10/2003 | Ponnekanti et al. | |
| 2003/0202868 A1 | 10/2003 | Bachrach | |
| 2004/0081546 A1 * | 4/2004 | Elliott et al. | 414/805 |
| 2005/0095110 A1 * | 5/2005 | Lowrance et al. | 414/736 |
| 2005/0135903 A1 | 6/2005 | Rice et al. | |
| 2005/0167554 A1 | 8/2005 | Rice et al. | |
| 2006/0072986 A1 | 4/2006 | Perlov et al. | |

(Continued)

OTHER PUBLICATIONS

Shah et al., U.S. Appl. No. 12/684,660 (13250), filed Jan. 8, 2010.

(Continued)

*Primary Examiner* — C. J Arbes
(74) *Attorney, Agent, or Firm* — Dugan & Dugan, P.C.

(57) ABSTRACT

Systems, methods, and apparatus are provided for electronic device manufacturing. The invention includes removing a first substrate carrier and a second substrate carrier from a moving conveyor using an end effector assembly and concurrently transferring the first and second substrate carriers from the moving conveyor to a support location via the end effector assembly. Numerous other aspects are provided.

17 Claims, 21 Drawing Sheets

U.S. PATENT DOCUMENTS

| | | |
|---|---|---|
| 2007/0237609 A1 | 10/2007 | Nulman et al. |
| 2007/0258796 A1 | 11/2007 | Englhardt et al. |
| 2007/0274813 A1 | 11/2007 | Elliott et al. |
| 2008/0050217 A1 | 2/2008 | Rice et al. |
| 2008/0051925 A1 | 2/2008 | Rice et al. |
| 2008/0071417 A1 | 3/2008 | Rice et al. |
| 2008/0187414 A1 | 8/2008 | Elliott et al. |
| 2008/0187419 A1 | 8/2008 | Rice et al. |
| 2008/0213068 A1 | 9/2008 | Weaver |
| 2008/0286076 A1 | 11/2008 | Elliott et al. |
| 2009/0030547 A1 | 1/2009 | Rice et al. |

OTHER PUBLICATIONS

Bachrach, U.S. Appl. No. 12/484,291 (5092-C02), filed Jun. 15, 2009.

* cited by examiner

METHODS FOR MOVING A SUBSTRATE CARRIER

RELATED APPLICATIONS

The present application claims priority to U.S. Provisional Patent Application No. 61/023,819 filed Jan. 25, 2008, and entitled "METHODS AND APPARATUS FOR MOVING A SUBSTRATE CARRIER" which is hereby incorporated herein by reference in its entirety for all purposes.

FIELD OF THE INVENTION

The present invention relates generally to electronic device manufacturing, and more particularly to methods and apparatus for moving a substrate carrier during electronic device manufacturing.

BACKGROUND

Existing systems for transferring substrate carriers between overhead transport systems (OHTs), storage systems, load ports, processing tools, etc. may become a bottleneck when used with improved electronic device manufacturing systems that attempt to move substrates around the manufacturing facility more quickly than conventional systems. Such bottlenecks may impact manufacturing throughput. Thus, what are needed are improved systems, methods and apparatus for moving a substrate carrier during electronic device manufacturing. What are further needed are improved systems, methods and apparatus for moving a substrate carrier that improves throughput in electronic device manufacturing facilities.

SUMMARY OF THE INVENTION

In some aspects of the invention, a method is provided for electronic device manufacturing. The method includes removing a first substrate carrier and a second substrate carrier from a moving conveyor using an end effector assembly; and concurrently transferring the first and second substrate carriers from the moving conveyor to a support location via the end effector assembly.

In other aspects of the invention, another method is provided for electronic device manufacturing. The method includes removing a first substrate carrier and second substrate carrier from respective support locations via an end effector assembly; and concurrently transferring the first and second substrate carriers between the support locations and a moving conveyor via the end effector assembly.

In yet other aspects of the invention, yet another method is provided. The method includes providing an end effector assembly having at least a first substrate carrier support and a second substrate carrier support for respectively supporting a first substrate carrier and a second substrate carrier; employing the first substrate carrier support to load a first substrate carrier onto or unload the first substrate carrier from the moving conveyor; and employing the second substrate carrier support to load a second substrate carrier onto or unload the second substrate carrier from the moving conveyor.

In still yet other aspects of the invention, an apparatus is provided for electronic device manufacturing. The apparatus includes an end effector assembly having (1) a rotatable arm, having a first end and a second end; (2) a first substrate carrier support coupled to the first end; and (3) a second substrate carrier support coupled to the second end. The end effector assembly is adapted to remove a first substrate carrier and a second substrate carrier from a moving conveyor; and concurrently transfer the first and second substrate carriers between the moving conveyor and a support location.

In another aspect of the invention, another apparatus is provided for electronic device manufacturing. The apparatus includes an end effector assembly including (1) a rotatable arm, having a first end and a second end; (2) a first substrate carrier support coupled to the first end; and (3) a second substrate carrier support coupled to the second end. The end effector assembly is adapted to remove a first substrate carrier and second substrate carrier from respective support locations; and concurrently transfer the first and second substrate carriers between the support locations and a moving conveyor. Numerous other aspects are provided in accordance with these and other aspects of the invention.

Other features and aspects of the present invention will become more fully apparent from the following detailed description, the appended claims and the accompanying drawings.

DETAILED DESCRIPTION

During electronic device manufacturing, one or more substrate carriers may be coupled to, or removed from, a moving (e.g., continuously-moving) conveyor adapted to transport substrate carriers about an electronic device manufacturing facility. In some electronic device manufacturing systems, an end effector coupled to a robot may be employed to transfer a substrate carrier from the moving conveyor to a support location or from the support location to the moving conveyor. During a typical operational sequence, the robot and end effector coupled thereto are launched from a predetermined starting location. The robot may be adapted to move the end effector along two axes (e.g., along a vertical and horizontal axis) such that the end effector may transfer the substrate from the moving conveyor to the support location, or from the support location to the moving conveyor. However, in such systems, the end effector may only transfer a single substrate carrier during the operational sequence, thereby limiting electronic device manufacturing throughput.

Consequently, the present invention provides methods and apparatus for moving a plurality of substrate carriers between the moving conveyor and respective support locations during a single operational sequence. More specifically, an end effector assembly including first and second substrate carrier supports may be coupled to the robot and rotate relative thereto, thereby serving as a rotary dual end effector assembly. During an operational sequence, the robot and rotary dual end effector assembly coupled thereto are launched from a predetermined starting location. The robot may be adapted to rotate and/or move the rotary dual end effector assembly along two axes (e.g., along a vertical and horizontal axis) such that, during the operational sequence, the first substrate carrier support may transfer the first substrate carrier and the second substrate carrier support may transfer the second substrate carrier from the moving conveyor to respective support locations, or the first substrate carrier support may transfer the first substrate carrier and the second substrate carrier support may transfer the second substrate carrier from respective support locations to the moving conveyor. By transferring two substrate carriers between the moving conveyor and respective support locations during a single operational sequence, the present methods and apparatus may improve electronic device manufacturing (e.g., by increasing manufacturing throughput compared to systems in which only a single substrate carrier may be transferred during an operational sequence).

Figure 1:
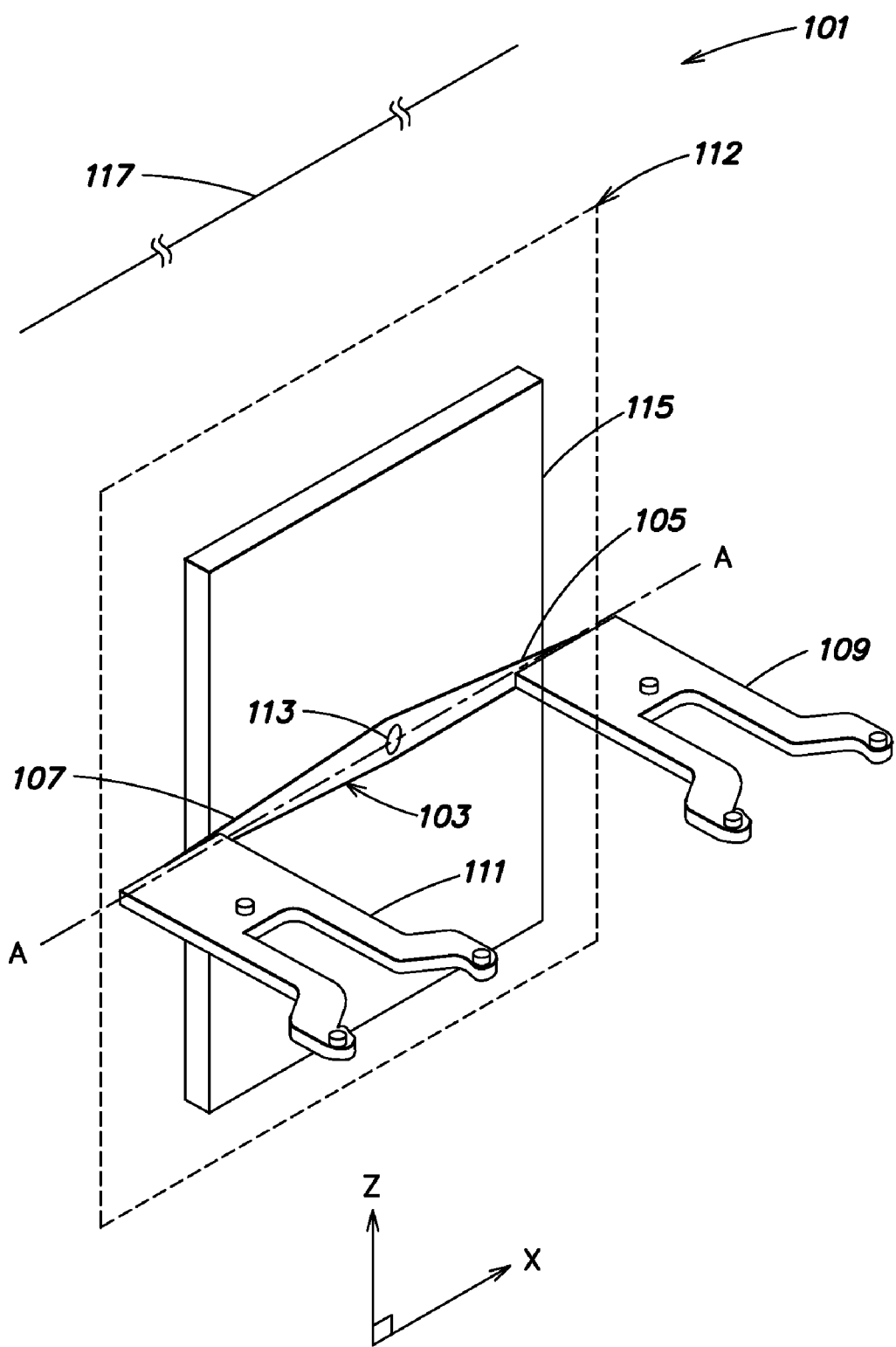
FIG. 1 is a block diagram of an end effector assembly in accordance with an embodiment of the present invention.

FIG. 1 is a block diagram of an end effector assembly in accordance with an embodiment of the present invention. With reference to FIG. 1, the end effector assembly 101 may include an arm 103 including a first end 105 and a second end 107. A first substrate carrier support 109 (e.g., first end effector) adapted to support a first substrate carrier (not shown in FIG. 1; 721 in FIG. 7) may be coupled to a point on the first end 105 such that the first substrate carrier support 109 may rotate about the point. Similarly, a second substrate carrier support 111 (e.g., second end effector) adapted to support a substrate carrier (not shown in FIG. 1; 723 in FIG. 7) may be coupled to a point on the second end 107 such that the second substrate carrier support 111 may rotate about the point. Further, the arm 103 may be coupled to a robot 112 (shown in phantom) such that the arm 103 may rotate relative to the robot 112. More specifically, a point 113 between the first ends 105 and the second end 107 (e.g., center point) of the arm 103 may be coupled to a back plate 115 such that the arm 103 may rotate about the point 113. The back plate 115 may be coupled to the robot 112, which is adapted to rotate the arm 103 relative to an axis such as a horizontal axis (e.g., x-axis) and/or to move along a plurality of axes, such as the horizontal axis and a vertical axis (e.g., z-axis), thereby moving the end effector assembly 101 along such axes. As the arm 103 rotates about the point 113, the first and second substrate carrier supports 109, 111 may rotate about respective points on the arm 113 to which the first and second substrate carrier supports 109, 111 are coupled. In this manner, the arm 103 may serve as an end effector rotator, and therefore, the end effector assembly 101 may serve as a rotary dual end effector assembly. The robot 112 may include any suitable robot mechanism or apparatus that may accomplish rotation of the arm 103 about the point 113. Further, the robot 112 may be adapted to cause translation of the back plate 115 and coupled arm 103 and the substrate carrier supports 109, 111 in the horizontal axis (e.g., x-axis) and/or in the vertical axis (e.g., z-axis). Optionally, the backing plate 115 may have a rotational imparting robot secured to it whose shaft(s) are adapted to carry out the rotation of the arm 103 and the substrate carrier supports 109, 111. A separate robot apparatus may be adapted to translate the backing plate and coupled arm and substrate carrier supports 109, 111 along the horizontal axis (e.g., x-axis) and/or the vertical axis (e.g., z-axis). The translation motion may be provided by any suitable translation robot, such as the robot apparatus described in U.S. Patent Application Publication Numbers 2003/0202868 published Oct. 30, 2003, and 2004/0081538 published Apr. 29, 2004, each of which is hereby incorporated by reference herein in its entirety.

In some embodiments, the first and/or second substrate carrier supports 109, 111 may be an end effector adapted to support a substrate carrier from the top or bottom, such as the end effectors described in U.S. patent application Ser. No. 11/180,029, filed Jul. 12, 2005 and titled "Methods and Apparatus For Repositioning Support for a Substrate Carrier" now U.S. Patent Application Publication 2006/0013674 and U.S. Pat. No. 7,099,744, filed Aug. 28, 2003 and titled "Substrate Carrier Handler That Unloads Substrate Carriers Directly From A Moving Conveyor" which are both hereby incorporated by reference herein in their entirety. Further, in some embodiments, the substrate carrier supports 109, 111 may be adapted to support small lot size substrate carriers. As used herein, small lot size substrate carriers may be specifically adapted to hold a maximum capacity of substrates that is less than the maximum capacity of conventional large lot sized substrate carriers which, for example, typically are configured to hold a maximum of 13 or 25 substrates. Thus, for example, the substrate carrier supports 109, 111 may be adapted to support a substrate carrier that is about 14.6 in. wide, about 13.7 inches long, about 2.5 in. high and includes an overhead transfer flange about 0.9 in. tall. Such small lot size substrate carriers may store a maximum, for example, of 1, 2, 3, 4, 5, or more substrates, but less than 13 substrates. However, the substrate carrier supports 109, 111 of the end effector assembly 101 may support substrate carriers which are configured and/or dimensioned differently such that the substrate carriers may store a larger or smaller maximum number of substrates.

During operation, the end effector assembly 101 may concurrently transfer a plurality of substrate carriers (e.g., a first substrate carrier and a second substrate carrier) between a continuously-moving conveyor 117, which is adapted to move substrate carriers about an electronic device manufacturing facility, and one or more support locations (not shown in FIG. 1; 701 in FIGS. 7-20). Conveyor apparatus are described in commonly-assigned U.S. Pat. Nos. 7,077,264 and 7,346,431, which is hereby incorporated by reference herein in their entirety. More specifically, during an operational sequence, the robot 112 and end effector assembly 101 coupled thereto are launched from a predetermined start location (e.g., a home location). The robot 112 may be adapted to rotate and/or move the end effector assembly 101 along two axes (e.g., along a vertical and horizontal axis) such that, during the operational sequence, the first substrate carrier support 109 may transfer a first substrate carrier and the second substrate carrier support 111 may transfer a second substrate carrier from the continuously-moving conveyor system 117 to respective support locations, or the first substrate carrier support 109 may transfer the first substrate carrier and the second substrate carrier support 111 may transfer the second substrate carrier from respective support locations to the continuously-moving conveyor system 117. The support locations may be adapted for substrate carrier docking or simply for substrate carrier storage.

Details of the operation of the end effector assembly 101 to (1) remove a first substrate carrier and a second substrate carrier from the moving conveyor 117; and (2) concurrently transfer the first and second substrate carriers from the moving conveyor 117 to a support location in accordance with an embodiment of the present invention are described below with reference to FIGS. 1-20. To avoid obstructing the entire end effector assembly 101, the robot 112 is not shown in FIGS. 2-20. With reference to FIGS. 1-20, during an operational sequence, the robot 112 and end effector assembly 101 coupled thereto may be launched from the starting location. While in the starting location, the end effector assembly 101 may be oriented in a starting arrangement such that the arm 103, and therefore, the first and second substrate carrier supports 109, 111 are substantially parallel to the x-axis (as shown in FIG. 1). More specifically, a central axis A of the arm 103, and therefore, the first and second substrate carrier supports 109, 111 form about a 0° angle with the x-axis. However, in some embodiments, while in the starting arrangement, the arm 103, first substrate carrier support 109 and/or second substrate carrier support 111 may form a larger or smaller angle with the x-axis. While in the start location, the first and second substrate carrier supports 109, 111 may be empty.

Figure 2:
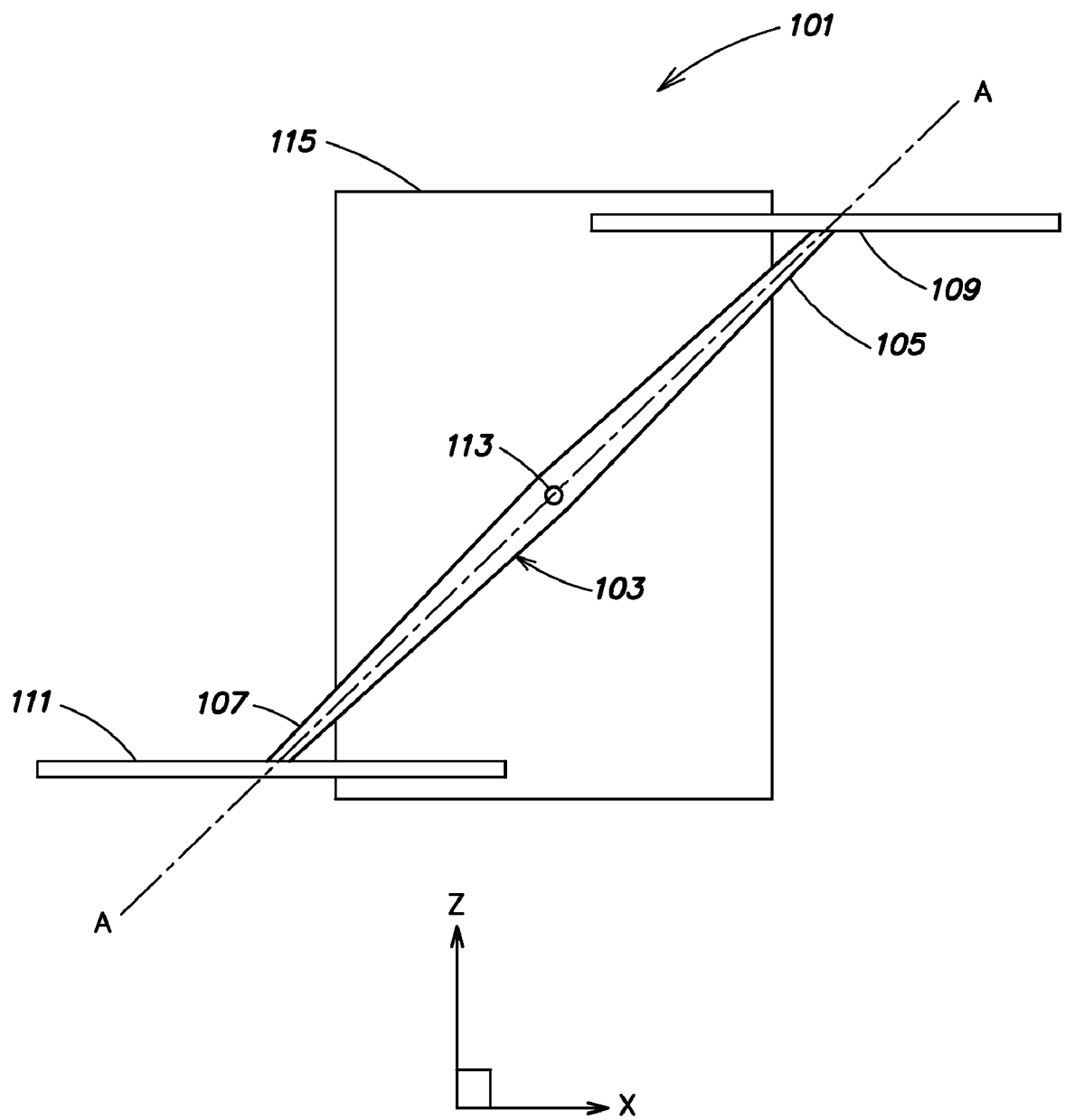
FIG. 2 is a block diagram of the end effector assembly in a first rotated arrangement in accordance with an embodiment of the present invention.
Figure 3:
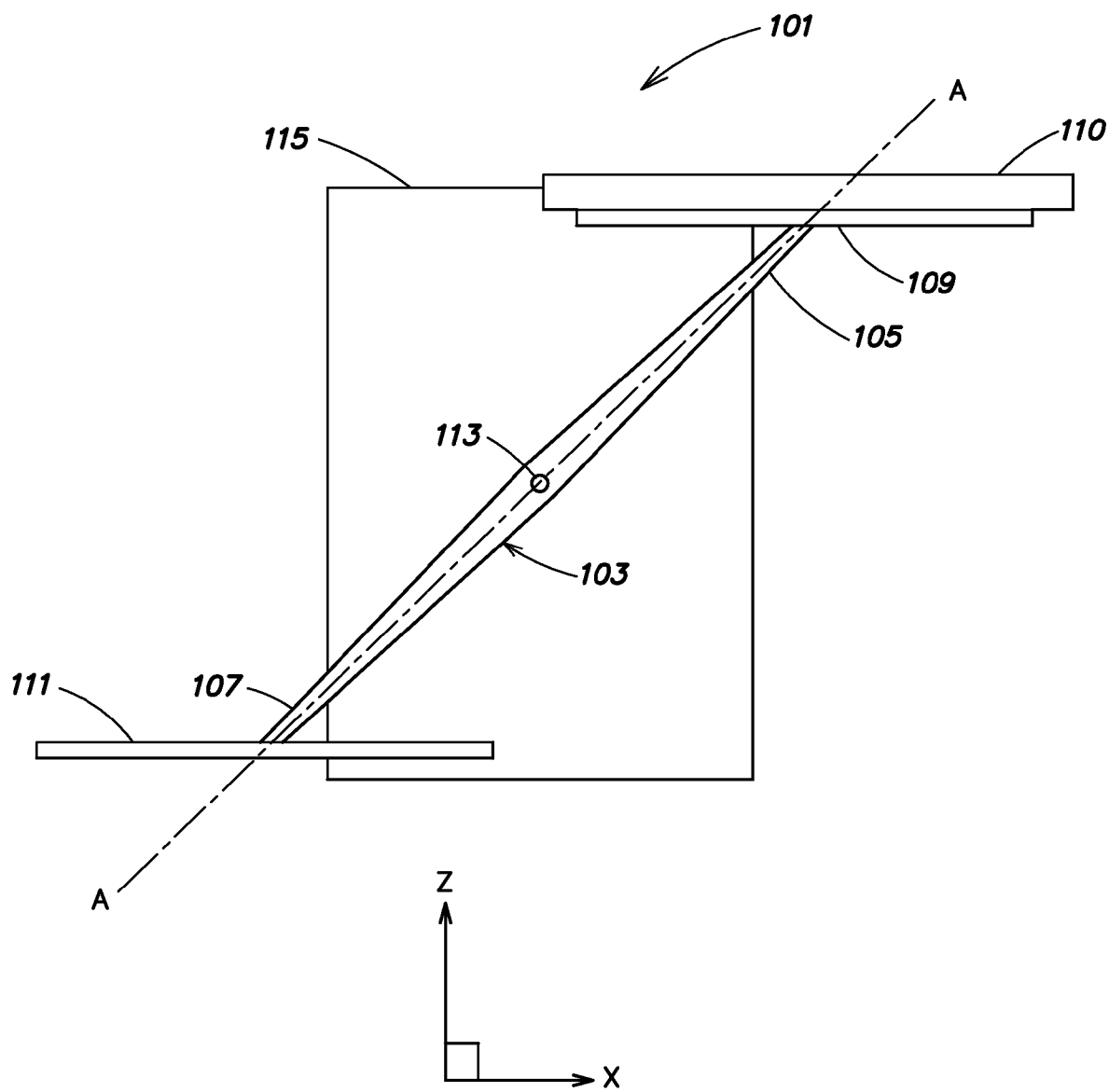
FIG. 3 is a block diagram of the end effector assembly in the first rotated arrangement supporting a first substrate carrier in accordance with an embodiment of the present invention.

Once launched from the starting location, to remove the first substrate carrier from the continuously-moving conveyor 117, the robot may cause the end effector assembly 101 to move along the first axis (e.g., the z-axis), to move along the second axis (e.g., the x-axis) and/or rotate relative to a second axis. For example, FIG. 2 is a block diagram of the end effector assembly 101 in a first rotated arrangement in accordance with an embodiment of the present invention. With reference to FIG. 2, the robot may cause the end effector assembly 101 to rotate counter (e.g., clockwise) to the first rotated arrangement such that the central axis A of the arm 103 forms an angle of about 45° with the x-axis, thereby raising the first substrate carrier support 109 higher than the second substrate carrier support 111. In this manner, the first substrate carrier support 109 may remove a first substrate carrier from the continuously-moving conveyor 117. Additionally or alternatively, the robot may cause the end effector assembly 101 to move along at least one of the first and second axes (e.g., z-axis and x-axis, respectively) before, after, and/or while rotating the end effector assembly 101 to the first rotated arrangement. In this manner, once launched from the starting location, the robot may move (e.g., translate) and/or rotate the end effector assembly 101 such that the speed of the end effector assembly 101 substantially matches the speed at which the conveyor 117 moves and the first substrate carrier support 109 may remove the first substrate carrier from the continuously-moving conveyor 117 and support the first substrate carrier. FIG. 3 is a block diagram of the end effector assembly 101 in the first rotated arrangement supporting the first substrate carrier 110 on the first substrate carrier support 109 in accordance with an embodiment of the present invention.

Figure 4:
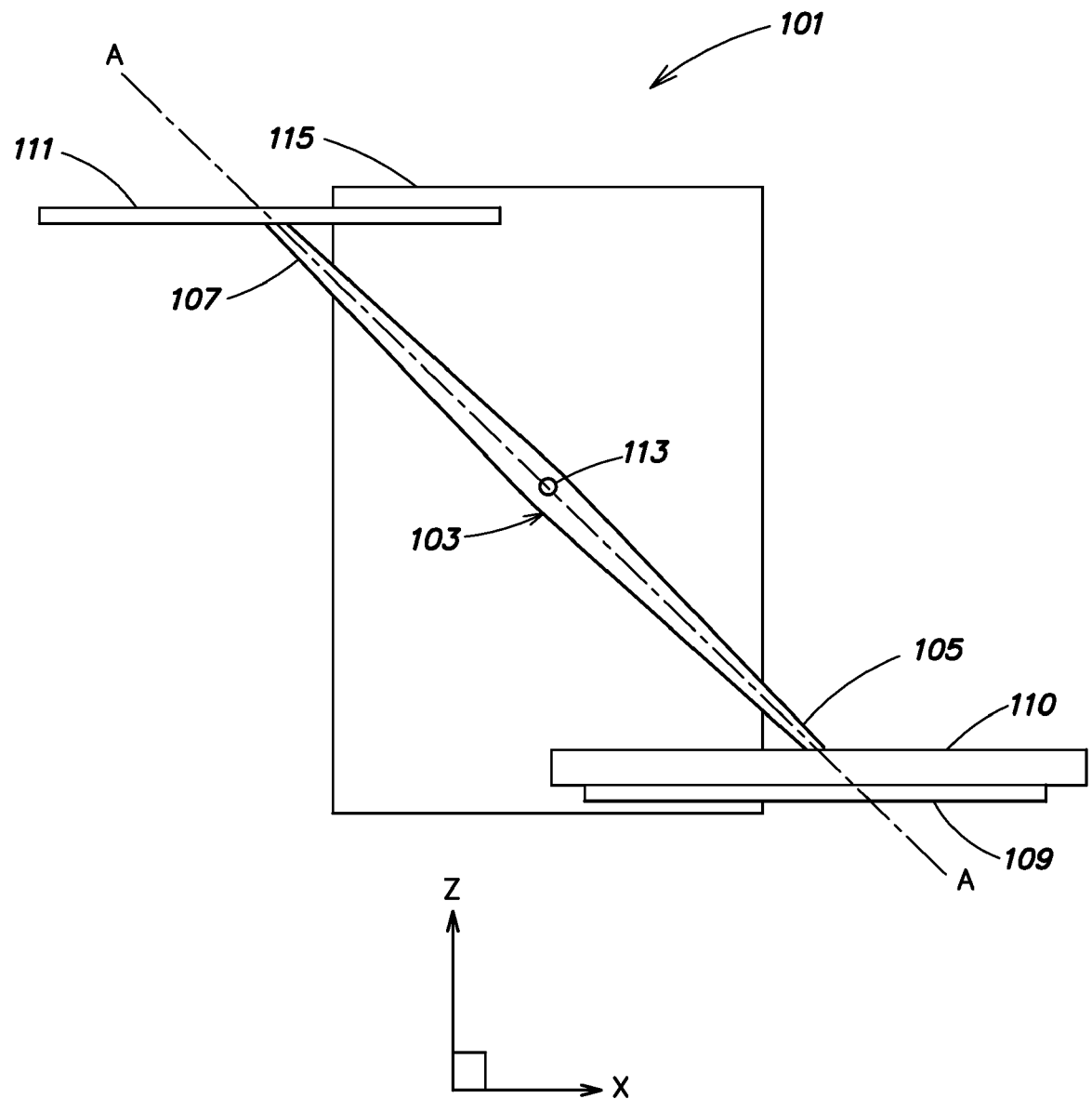
FIG. 4 is a block diagram of the end effector assembly in a second rotated arrangement supporting the first substrate carrier in accordance with an embodiment of the present invention.
Figure 5:
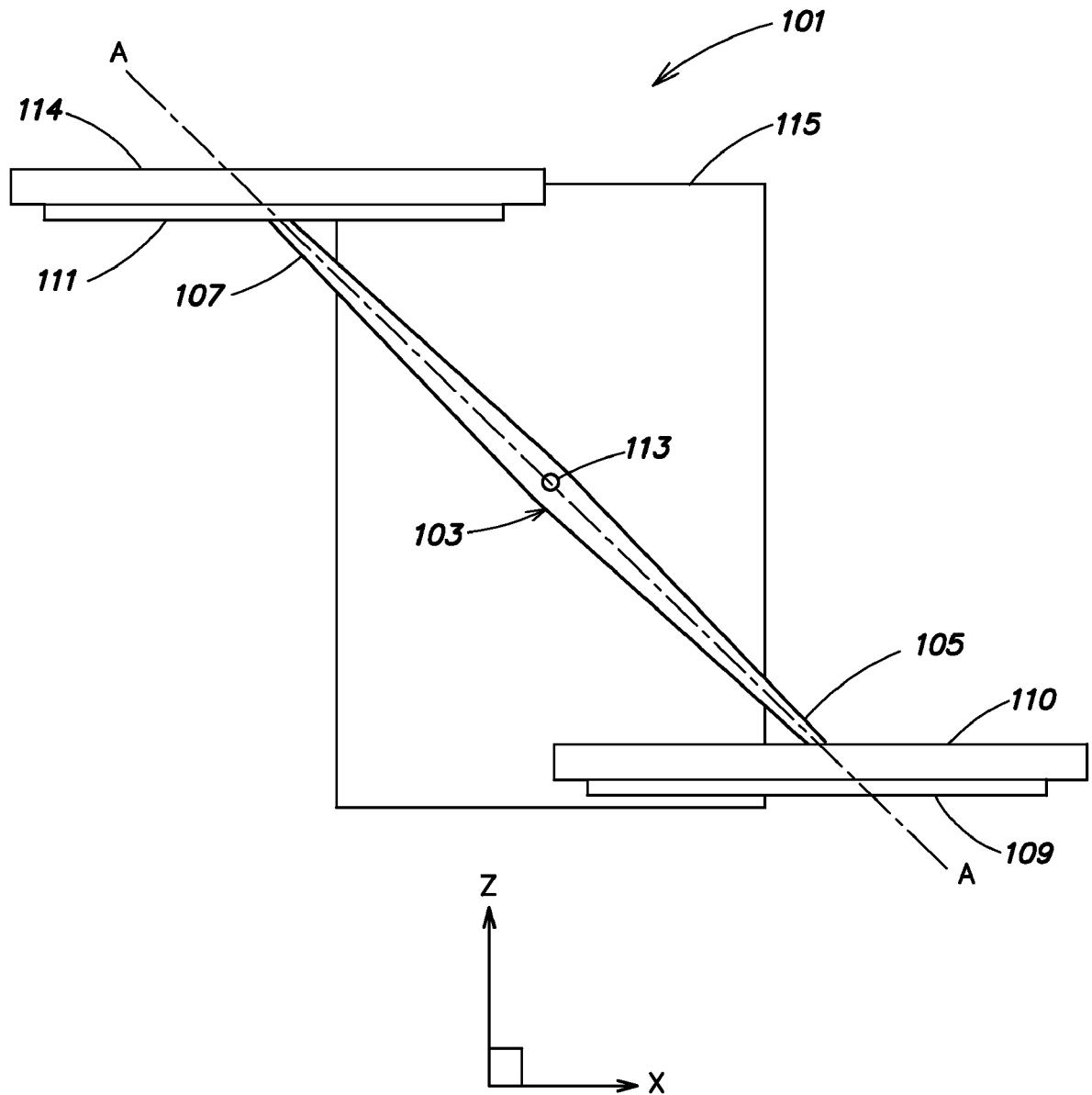
FIG. 5 is a block diagram of the end effector assembly in the second rotated arrangement supporting the first substrate carrier and a second substrate carrier in accordance with an embodiment of the present invention.

To remove a second substrate carrier from the continuously-moving conveyor 117, the robot may cause the end effector assembly 101 to move along the first axis (e.g., z-axis), to move along a second axis (e.g., the x-axis) and/or rotate relative to the second axis. For example, FIG. 4 is a block diagram of the end effector assembly 101 in a second rotated arrangement supporting the first substrate carrier 110 on the first substrate carrier support 109 in accordance with an embodiment of the present invention. With reference to FIG. 4, the robot may cause the end effector assembly 101 to rotate to the second rotated arrangement such that the central axis A of the arm 103 forms an angle of about −45° with the second axis (e.g., x-axis), thereby raising the second substrate carrier support 111 higher than the first substrate carrier support 109. In this manner, the second substrate carrier support 111 may remove a second substrate carrier from the continuously-moving conveyor 117. Additionally or alternatively, the robot may cause the end effector assembly 101 to move (translate) along at least one of the first and second axes (e.g., z-axis and x-axis, respectively) before, after, and/or while rotating the end effector assembly 101 to the second rotated arrangement. In this manner, after removing the first substrate carrier from the continuously-moving conveyor 117, the robot may move and/or rotate the end effector assembly 101 such that the speed of the end effector assembly 101 substantially matches the speed at which the conveyor 117 moves and the second substrate carrier support 111 may remove the second substrate carrier from the continuously-moving conveyor 117 and support the second substrate carrier. FIG. 5 is a block diagram of the end effector assembly in the second rotated arrangement supporting the first substrate carrier 110 on the first substrate carrier support 109 and a second substrate carrier 114 on the second substrate carrier support 111 in accordance with an embodiment of the present invention.

Figure 6:
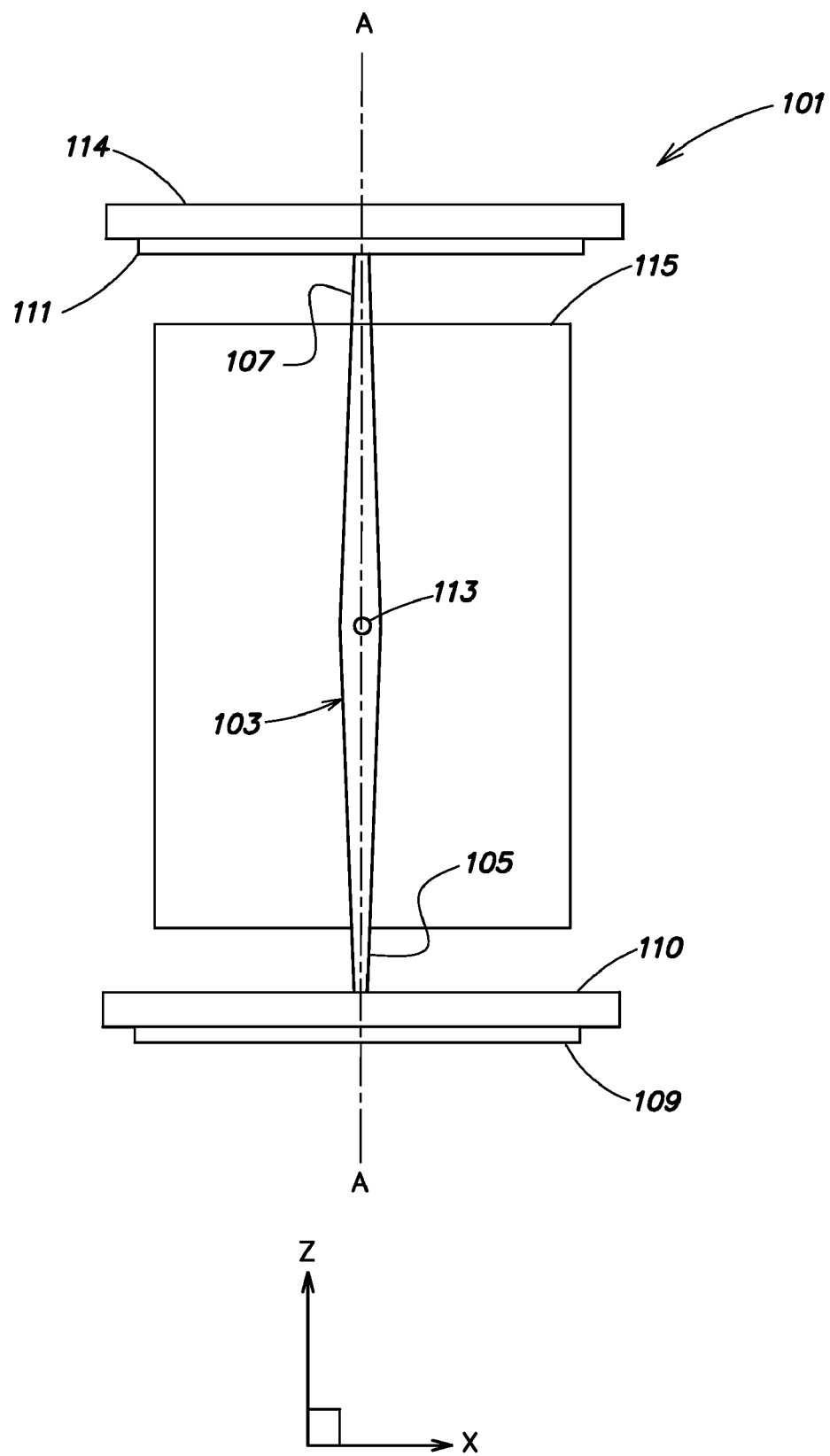
FIG. 6 is a block diagram of the end effector assembly in a third rotated arrangement supporting the first and second substrate carriers in accordance with an embodiment of the present invention.

To concurrently transfer the first 110 and second substrate carriers 110, 114 from the moving conveyor 117 to a support location (e.g., shelf), the robot may cause the end effector assembly 101 to move along the first axis (e.g., z-axis), move along a second axis (e.g., the x-axis) and/or rotate relative to the second axis. For example, FIG. 6 is a block diagram of the end effector assembly in a third rotated arrangement supporting the first and second substrate carriers 110, 114 in accordance with an embodiment of the present invention. With reference to FIG. 6, the robot may cause the end effector assembly 101 to rotate to the third rotated arrangement such that the central axis A of the arm 103 forms an angle of about 90° with the second axis (e.g., x-axis). In this orientation, the first and second substrate carrier supports 109, 111 are substantially vertically aligned. For example, the first substrate carrier support 109 may be aligned such that the first substrate carrier support 109 is substantially directly below the second substrate carrier support 111. In this manner, the end effector assembly 101 is oriented for transfer between the between the continuously-moving conveyor 117 and a storage location via a tunnel (not shown in FIG. 6; 709 in FIGS. 7-20). More specifically, by rotating the end effector assembly 101 to the third rotated arrangement, the robot may reduce and/or minimize a footprint or the end effector assembly 101. In an alternative third rotated arrangement, the first substrate carrier support 109 may be oriented substantially directly above the second substrate carrier support 111 (opposite of what is shown in FIG. 6). Additionally or alternatively, the robot may cause the end effector assembly 101 to move (translate) along at least one of the first and second axes before, after, and/or while rotating the end effector assembly 101 to the third rotated arrangement. In this manner, the robot may properly position the robot (e.g., above a central longitudinal region of the tunnel) for descent into the tunnel. More specifically, the robot may rotate the end effector assembly to reduce the end effector assembly footprint and properly position the end effector assembly at the entrance of the tunnel thereby assuring the end effector assembly does not interfere with any support locations or any substrate carriers supported there at.

Thereafter, the robot may cause the end effector assembly to move along the first axis (e.g., z-axis). In this manner, the end effector descends into the tunnel. FIGS. 7-20 are block diagrams illustrating simultaneous transfer of a first substrate carrier 721 and a second substrate carrier 723 between a moving conveyor 117 and a support location using the end effector assembly 101 in accordance with an embodiment of the present invention. With reference to FIGS. 7-20, FIG. 7 is an isometric view of the end effector assembly 101 near a plurality of support locations 701 coupled to a facility wall 703 such as by fasteners or other suitable fastening methods.

Figure 7:
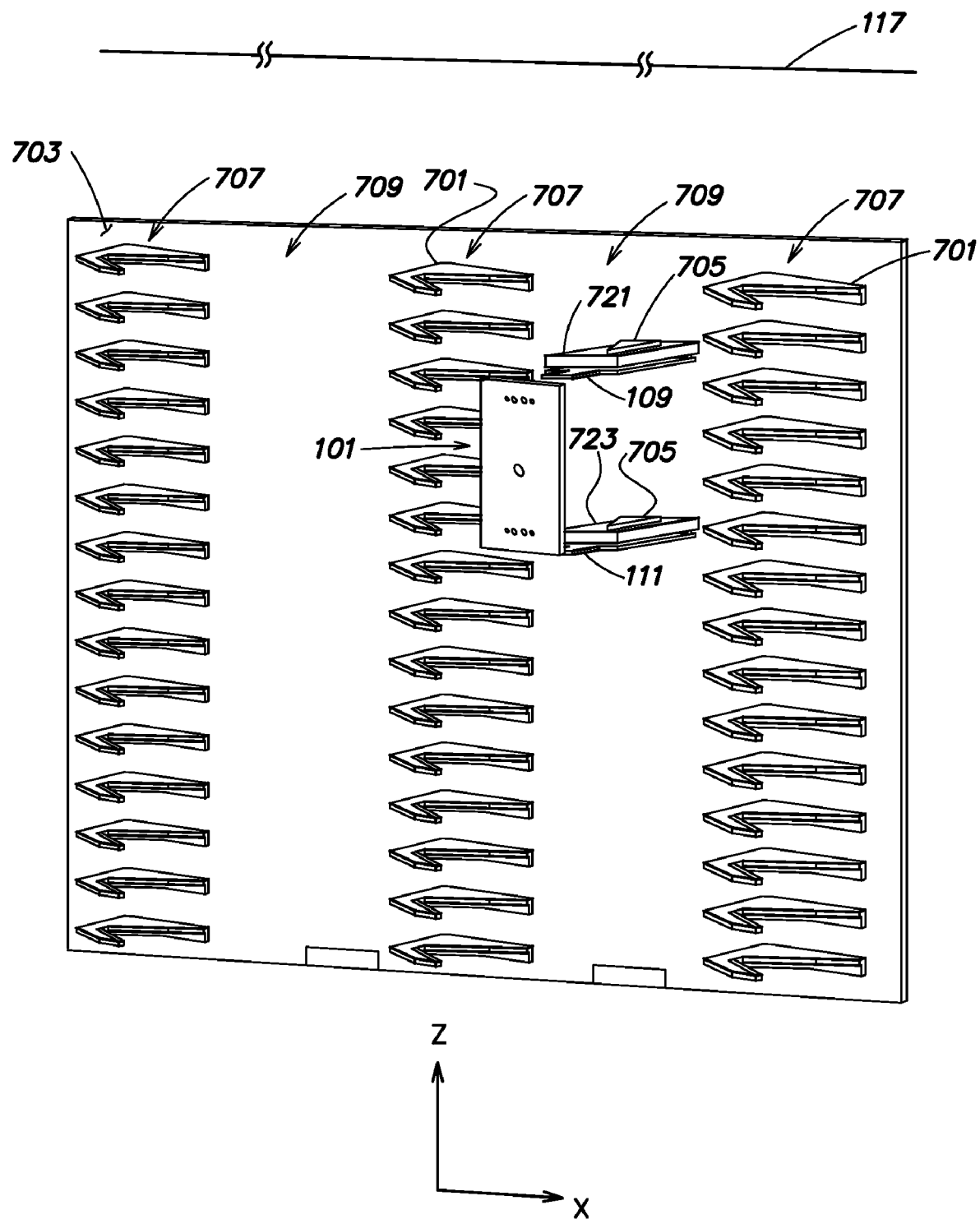
FIG. 7 is an isometric view of the end effector assembly near a plurality of support locations coupled to a facility wall in accordance with an embodiment of the present invention.

With reference to FIG. 7, one or more of the plurality of support locations 701 may be adapted to support a substrate carrier via an overhead transfer flange 705 of the substrate carrier 721. An identical transfer flange may be provided on the other substrate carriers (e.g., 723). However, one or more of the support locations 701 may be adapted to support the substrate carrier from another position (e.g., from a bottom of the substrate carrier) such as by the use of an arrangement of kinematic pins engaging with holes and/or slots formed in the substrate carrier.

The plurality of support locations 701 may be arranged in substantially vertical columns 707 such that adjacent columns 707 of support locations 701 define a tunnel 709 through which a substrate carrier transfer device, such as the end effector assembly 101 may travel. In some embodiments, three columns 707 of support locations 701, each of which includes twenty support locations 701, may be coupled to the wall 703. Therefore, the plurality of support locations 701 may define two tunnels 709. However, in other embodiments, the plurality of support locations 701 may be arranged in a larger or smaller number columns 707. Further, each column 707 may include a larger or smaller number of support locations 701.

Figure 8:
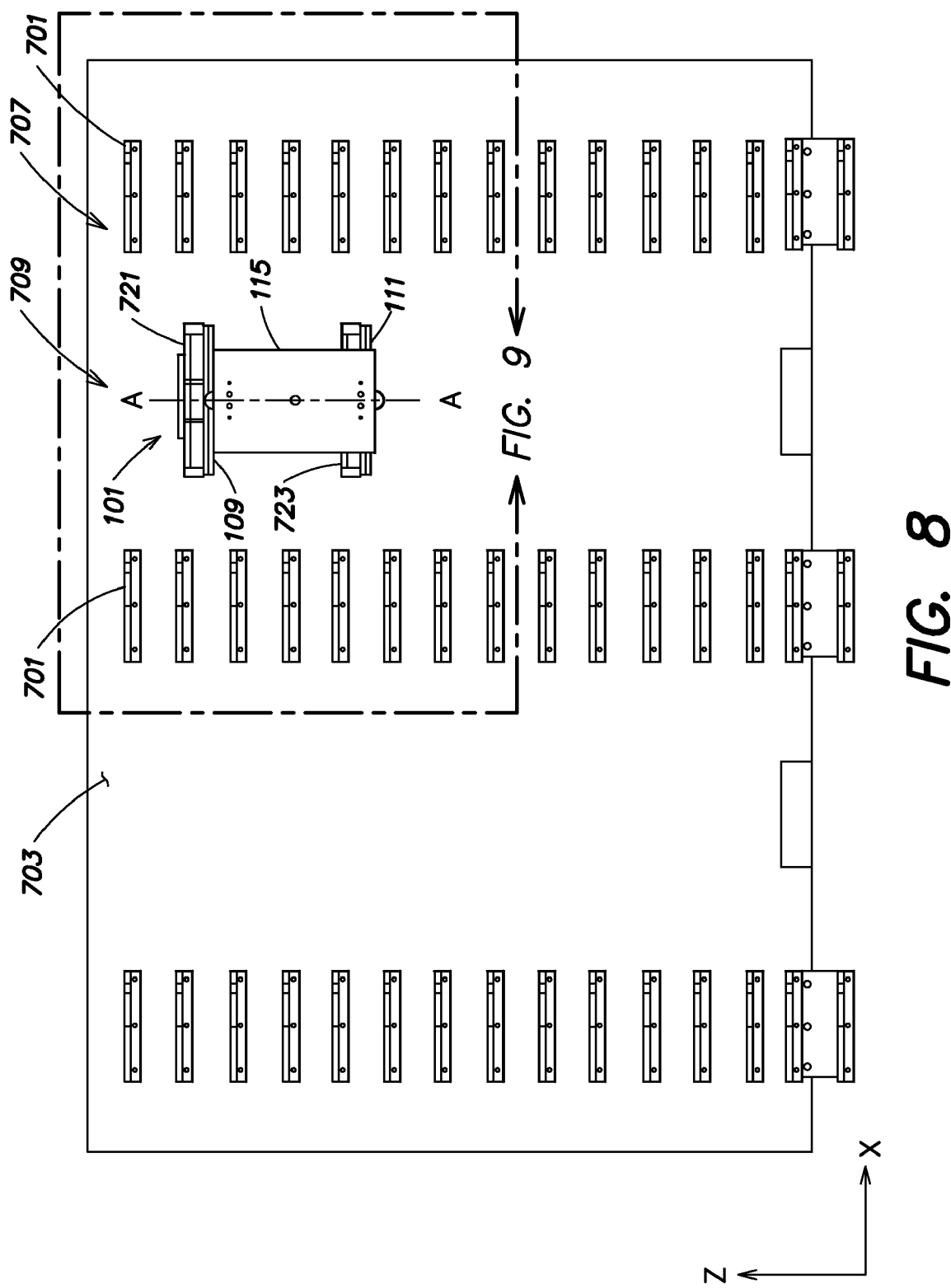
FIG. 8 is a block diagram of a rear view of the end effector assembly and a front view of the plurality of support locations coupled to the facility wall in accordance with an embodiment of the present invention.
Figure 9:
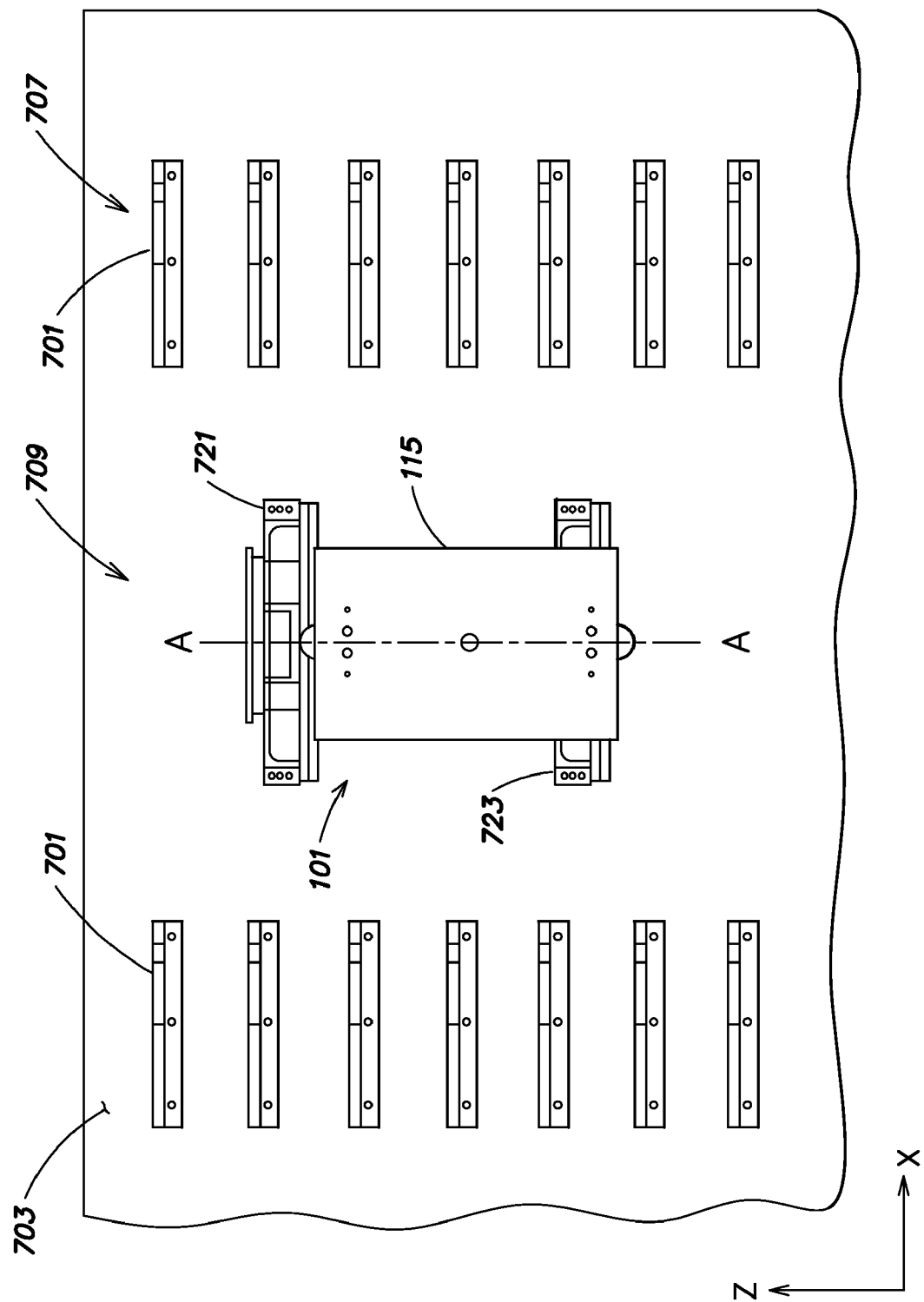
FIG. 9 is a block diagram of an enlarged rear view of the end effector assembly and a front view of a portion of the plurality of support locations coupled to the facility wall in accordance with an embodiment of the present invention.
Figure 10:
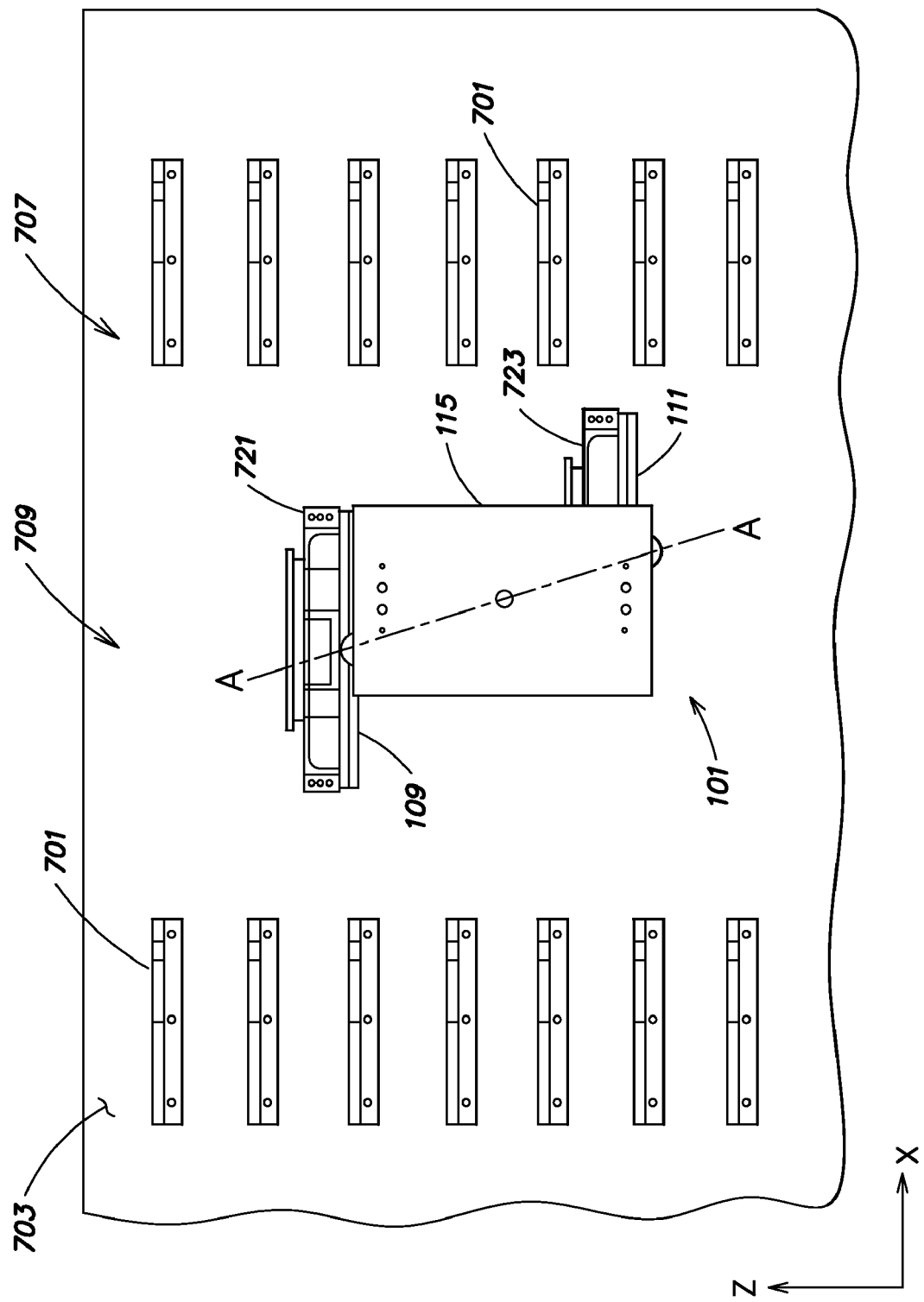
FIG. 10 is a block diagram of a first exemplary rear view of the end effector assembly as the end effector assembly rotates from a third rotated arrangement toward a starting arrangement in accordance with an embodiment of the present invention.

FIGS. 8 and 9 are block diagrams of a rear view of the end effector assembly 101 and a front view of the plurality of support locations 701 coupled to the facility wall 703, and an enlarged rear view of the end effector assembly 101 and a front view of a portion of the plurality of support locations 701 coupled to the facility wall 703, respectively. With reference to FIGS. 8 and 9, as the robot transfers (e.g., lowers) the end effector assembly 101 along the first axis (e.g., z-axis) into the tunnel 709, the end effector assembly 101 remains in the third rotated arrangement. The third rotated arrangement is an orientation where the first substrate carrier 721 is substantially vertically aligned with the second substrate carrier 723 or vice versa. Once the robot has transferred the end effector assembly 101 along the first axis to a desired height, the robot may begin to rotate the end effector assembly 101. FIG. 10 is a block diagram of a first exemplary rear view of the end effector assembly 101 as the end effector assembly 101 rotates from the third rotated arrangement where the substrate carrier supports 109, 111 are positioned vertically one above another, toward the starting arrangement in accordance with an embodiment of the present invention. With reference to FIG. 10, to load a substrate carrier (e.g., the second substrate carrier 723) onto a support location, the robot may begin to rotate the end effector assembly 101. In some embodiments, the robot may rotate the end effector assembly 101 while transferring the end effector assembly 101 along the second axis (e.g., x-axis) such that a substrate carrier is displaced from a substrate support carrier 109, 111 onto a support location 701. Alternatively, in other embodiments, the robot may rotate the end effector assembly 101, while transferring the end effector assembly 101 along the first axis (e.g., z-axis) and/or second axis (e.g., x-axis) such that a substrate carrier is displaced from a substrate support carrier 109, 111 onto the support location 701.

Figure 11:
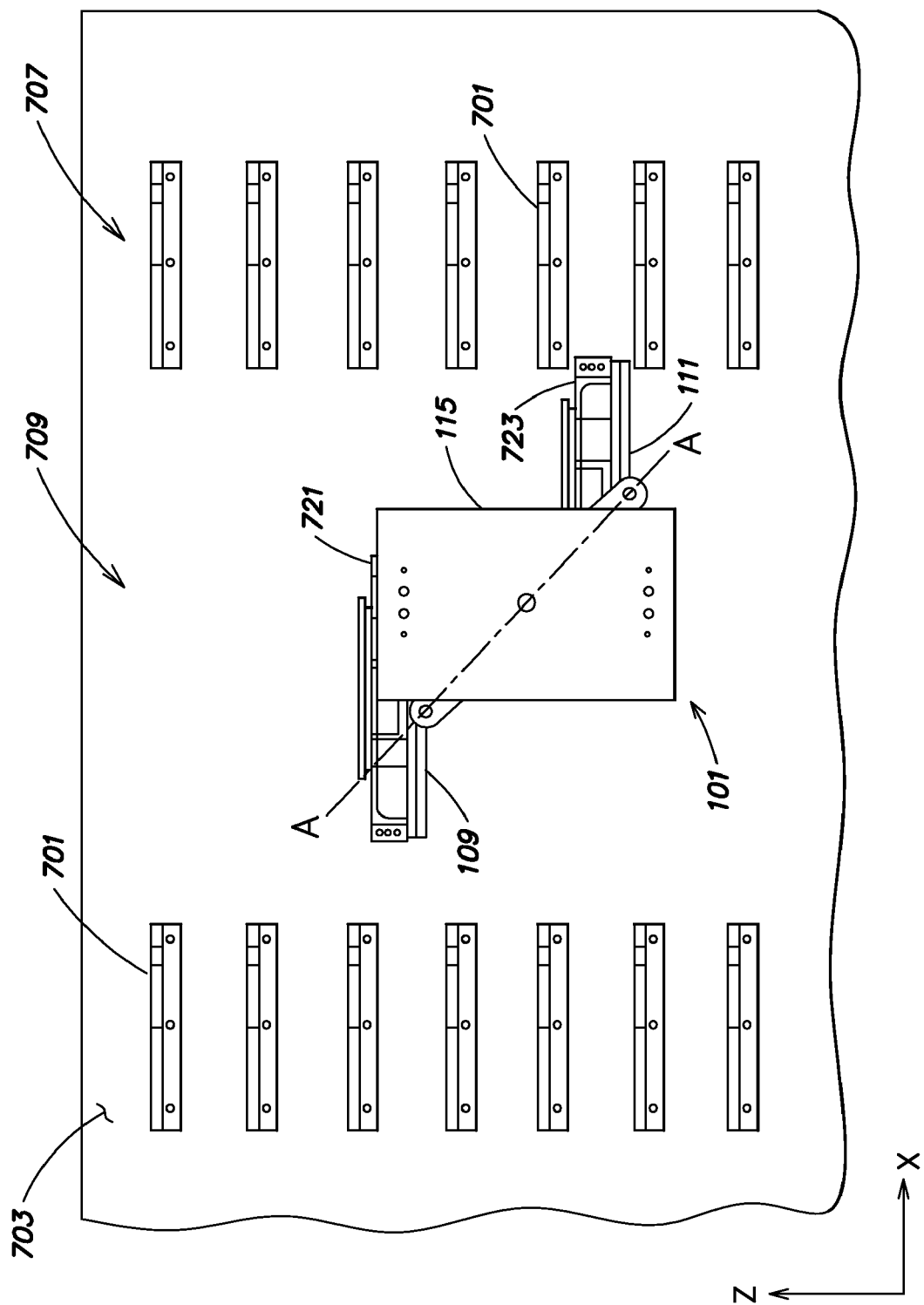
FIG. 11 is a block diagram of a second exemplary rear view of the end effector assembly as the end effector assembly continues to rotate from the third rotated arrangement toward the starting arrangement in accordance with an embodiment of the present invention.

For example, FIG. 11 is a block diagram of a second exemplary rear view of the end effector assembly as the end effector assembly continues to rotate from the third rotated arrangement toward the starting arrangement in accordance with an embodiment of the present invention. With reference to FIG. 11, the robot may continue to move the end effector assembly 101 along the first axis (e.g., z-axis) as the robot continues to rotate the end effector assembly 101. In this manner, the robot may cause the second substrate carrier support 111 and/or second substrate carrier 723 to enter the footprint of a support location 701 from below.

Figure 12:
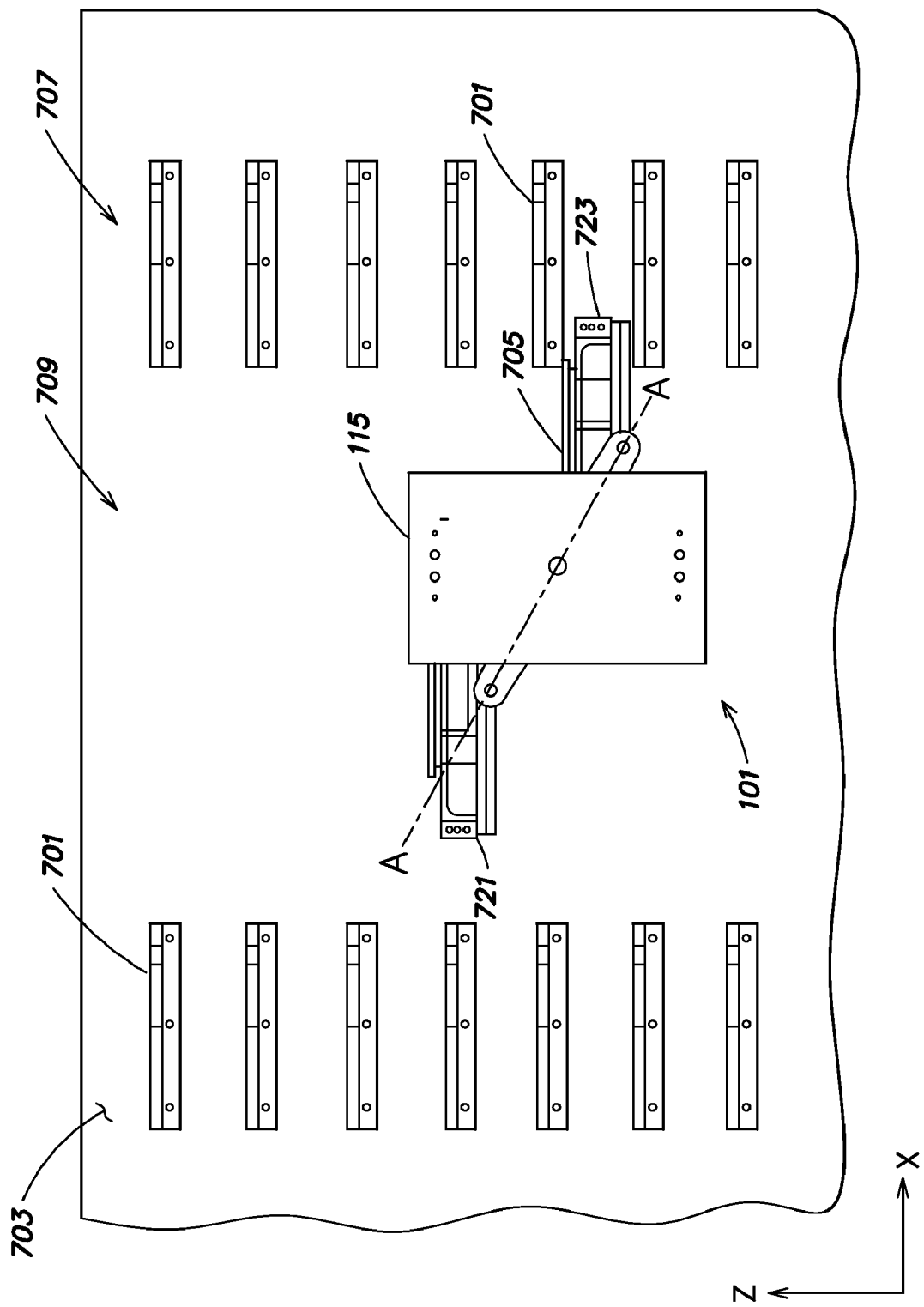
FIG. 12 is a block diagram of a third exemplary rear view of the end effector assembly as the end effector assembly continues to rotate from the third rotated arrangement toward the starting arrangement in accordance with an embodiment of the present invention.

FIG. 12 is a block diagram of a third exemplary rear view of the end effector assembly as the end effector assembly continues to rotate from the third rotated arrangement toward the starting arrangement in accordance with an embodiment of the present invention. With reference to FIG. 12, the robot may continue to move the end effector assembly 101 along the first axis (e.g., z-axis) as the robot continues to rotate the end effector assembly 101. Further, the robot may move the end effector assembly along the second axis (e.g., x-axis) while rotating the end effector assembly 101. In this manner, the robot may cause the overhead transfer flange 705 of the second substrate carrier 723 to move closer to the support location 701 from below.

Figure 13:
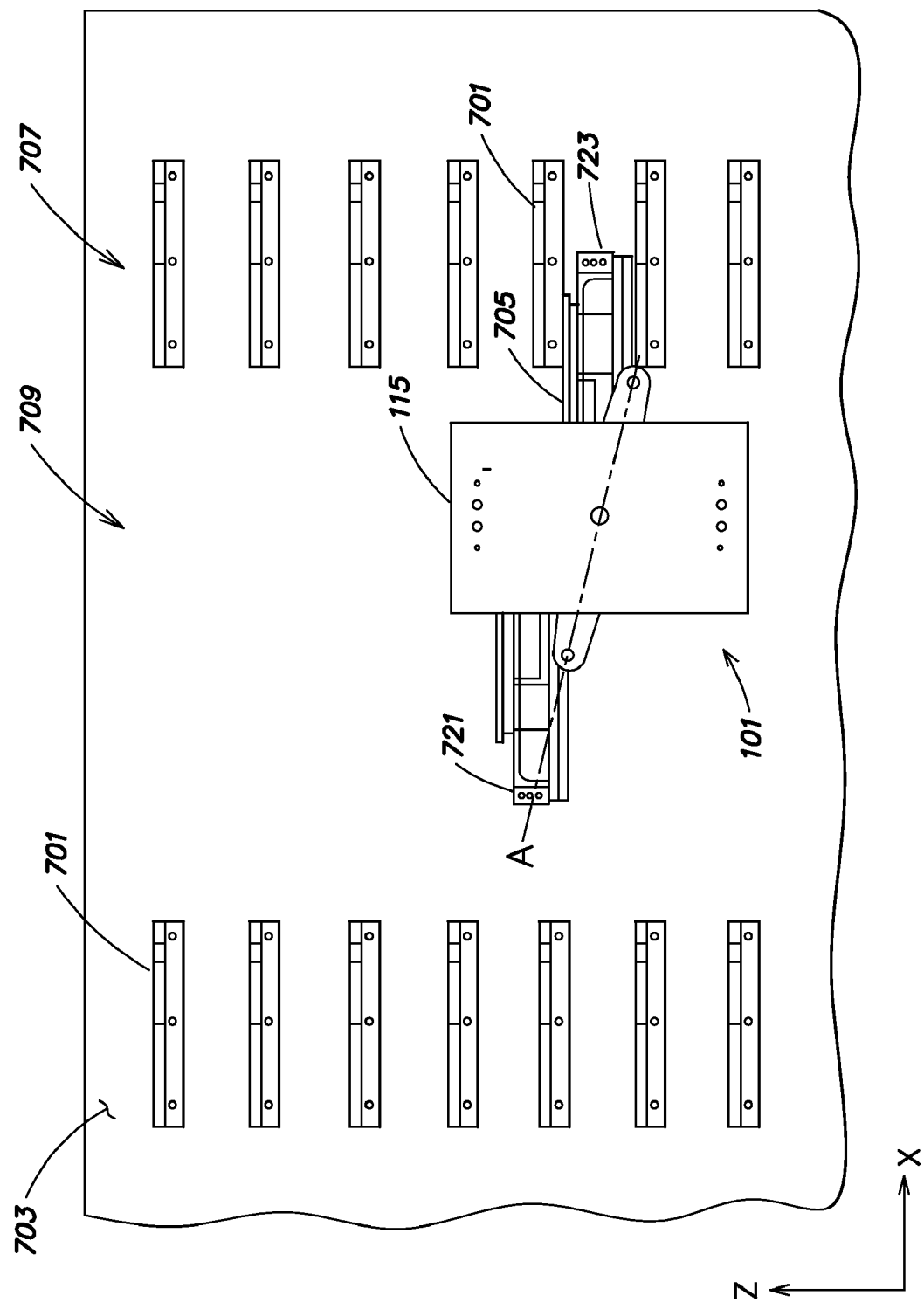
FIG. 13 is a block diagram of a fourth exemplary rear view of the end effector assembly as the end effector assembly continues to rotate from the third rotated arrangement toward the starting arrangement in accordance with an embodiment of the present invention.

FIG. 13 is a block diagram of a fourth exemplary rear view of the end effector assembly as the end effector assembly 101 continues to rotate from the third rotated arrangement toward the starting arrangement in accordance with an embodiment of the present invention. Similar to the movement shown in FIG. 12, with reference to FIG. 13, the robot may continue to move the end effector assembly 101 along the first axis (e.g., z-axis) as the robot continues to rotate the end effector assembly 101. Further, the robot may move the end effector assembly 101 along the second axis (e.g., x-axis) while rotating the end effector assembly 101. In this manner, the robot may cause the overhead transfer flange 705 of the second substrate carrier 723 to move closer to the support location 701 and/or occupy a larger portion below the footprint of the support location 701.

Figure 14:
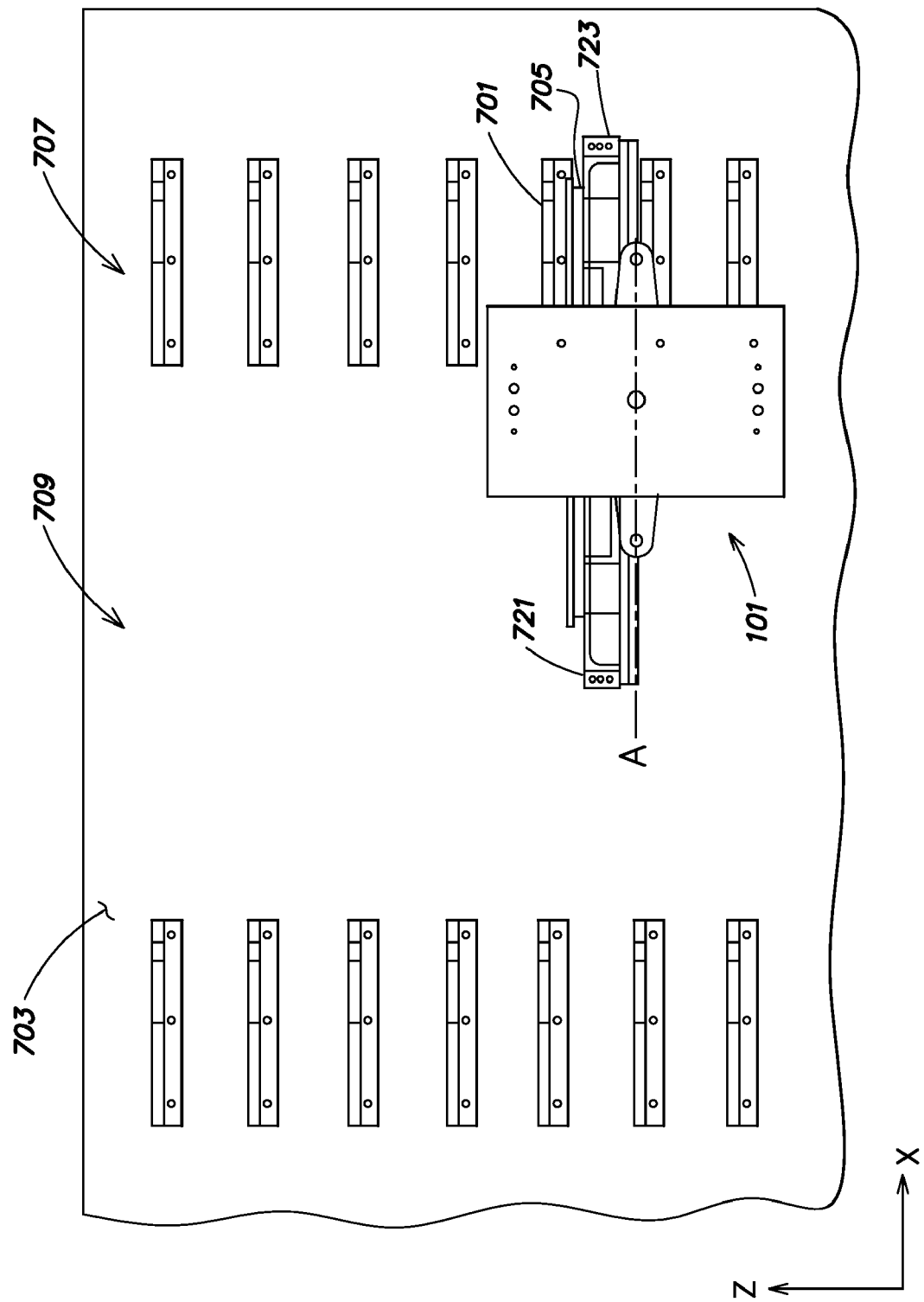
FIG. 14 is a block diagram of an exemplary rear view of the end effector assembly with the end effector assembly rotated to the starting arrangement in accordance with an embodiment of the present invention.

FIG. 14 is a block diagram of an exemplary rear view of the end effector assembly with the end effector assembly rotated to the starting arrangement in accordance with an embodiment of the present invention. Similar to the movement shown in FIGS. 12 and 13, with reference to FIG. 14, the robot may continue to rotate the end effector assembly 101 until the end effector assembly 101 is in the starting arrangement. Further, the robot may continue to move the end effector assembly 101 along the first axis (e.g., z-axis) and/or the second axis (e.g., x-axis) as the robot continues to rotate the end effector assembly 101. In this manner, the robot may substantially align the overhead transfer flange 705 of the second substrate carrier 723 below the support location 701.

Figure 15:
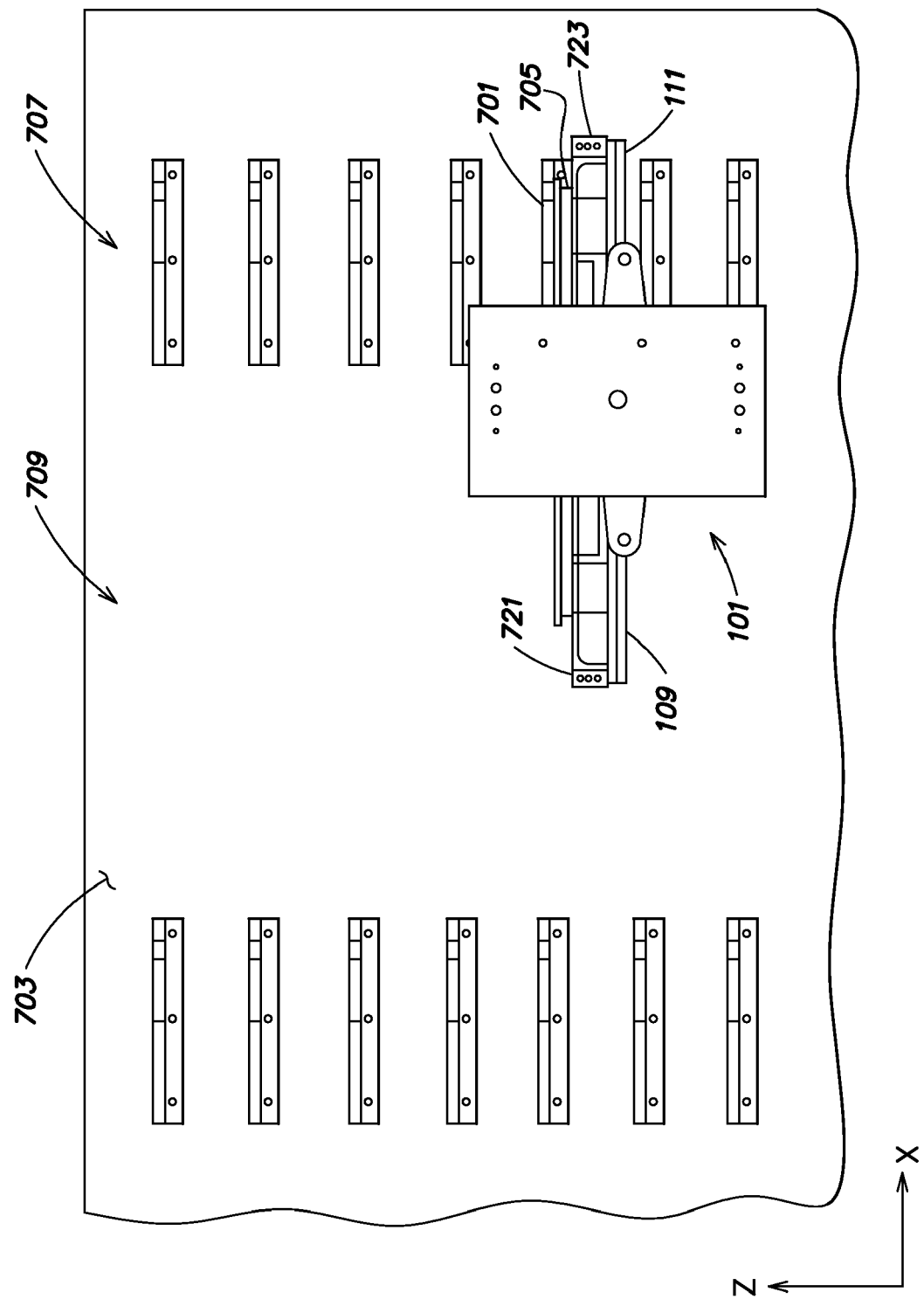
FIG. 15 is a block diagram of a rear view of the end effector assembly placing the second substrate carrier onto the support location in accordance with an embodiment of the present invention.

FIG. 15 is a block diagram of a rear view of the end effector assembly 101 placing the second substrate carrier onto the support location 701. With reference to FIG. 15, once the end effector assembly 101 is rotated to the starting arrangement, the robot may cause the end effector assembly 101 to move along the first axis (e.g., z-axis) and/or the second axis (e.g., x-axis) such that the second substrate carrier 723 is placed on the support location 701. For example, the robot may cause the end effector assembly 101 to move in a first direction (e.g., upward) along the first axis (e.g., z-axis) such that support location 701 engages the overhead transfer flange 705 of the second substrate carrier, thereby supporting the second substrate carrier.

Figure 16:
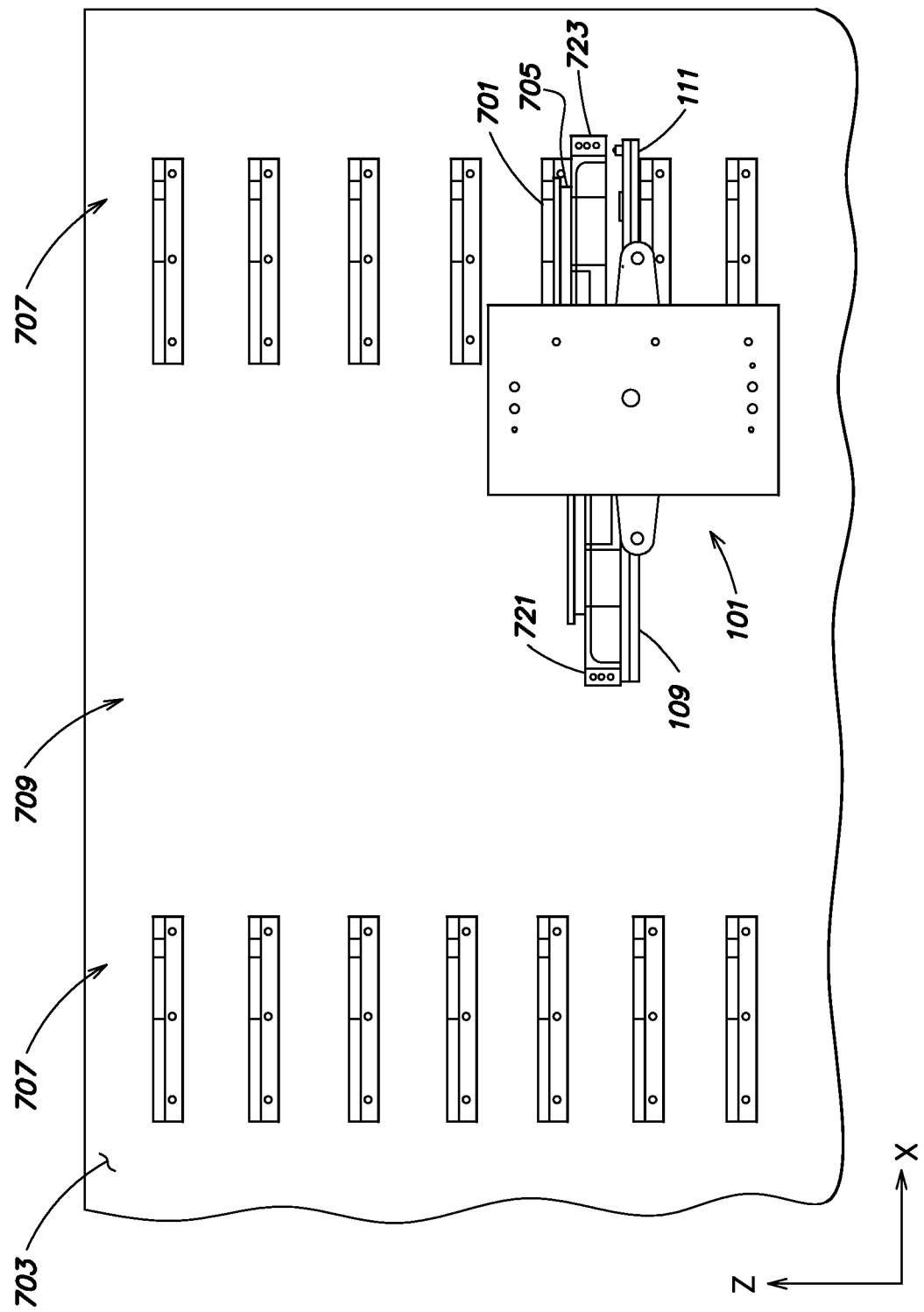
FIG. 16 is a block diagram of a rear view of the end effector assembly with an empty second substrate carrier support in accordance with an embodiment of the present invention.

Thereafter, the robot may cause the end effector assembly 101 to move along the first axis (e.g., z-axis) and/or the second axis (e.g., x-axis) such that the end effector assembly 101 no longer supports the second substrate carrier 723. For example, FIG. 16 is a block diagram of a rear view of the end effector assembly 101 with an empty second substrate carrier support 111. With reference to FIG. 16, the robot may cause the end effector assembly 101 to move in a second direction (e.g., downward) along the first axis (e.g., z-axis) such that the second substrate carrier support 111 disengages from the bottom surface of the second substrate carrier 723.

Figure 17:
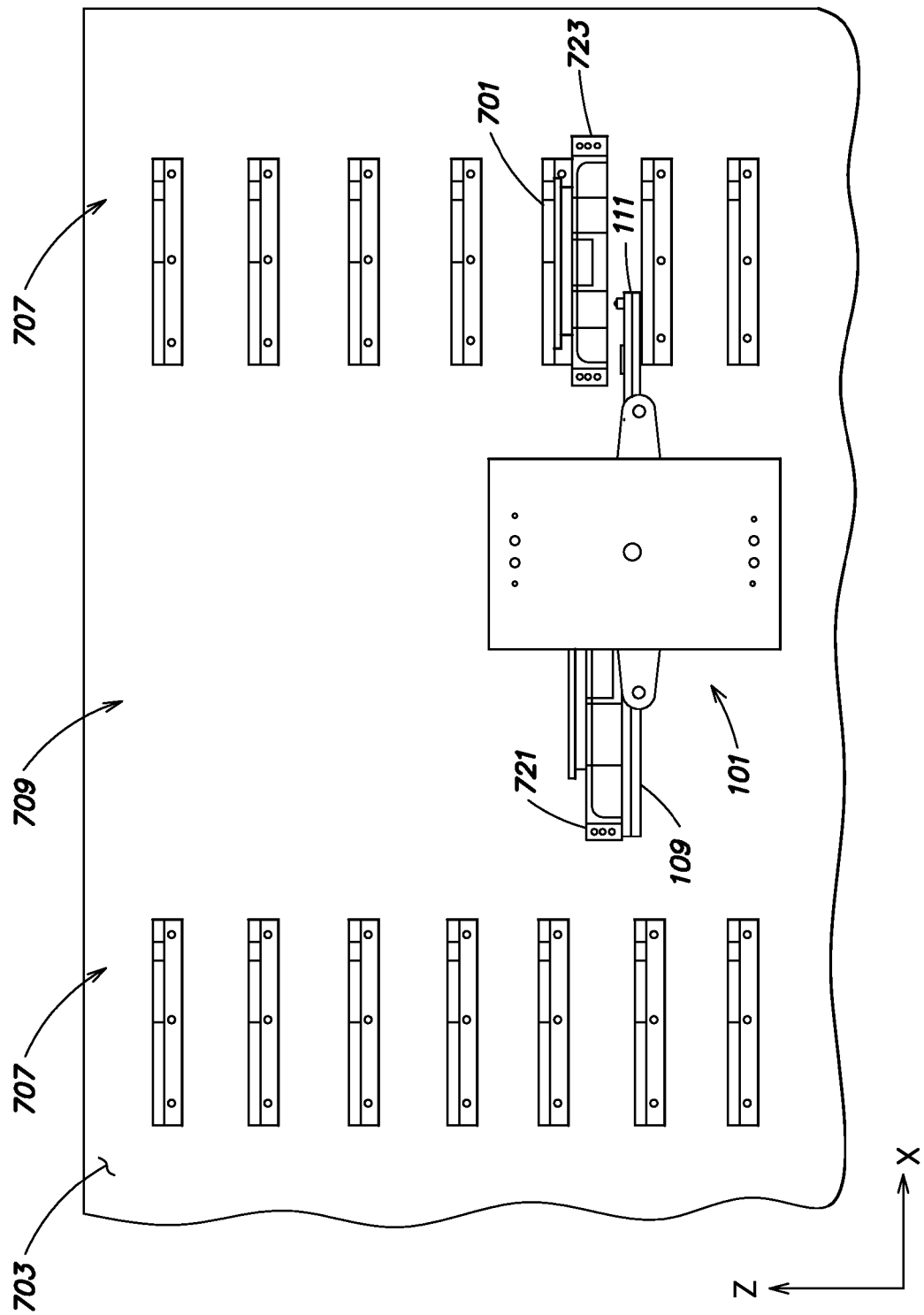
FIG. 17 is a block diagram of a first exemplary rear view of the end effector assembly as the robot positions the end effector assembly in the tunnel and rotates the end effector assembly to the third rotated arrangement in accordance with an embodiment of the present invention.
Figure 18:
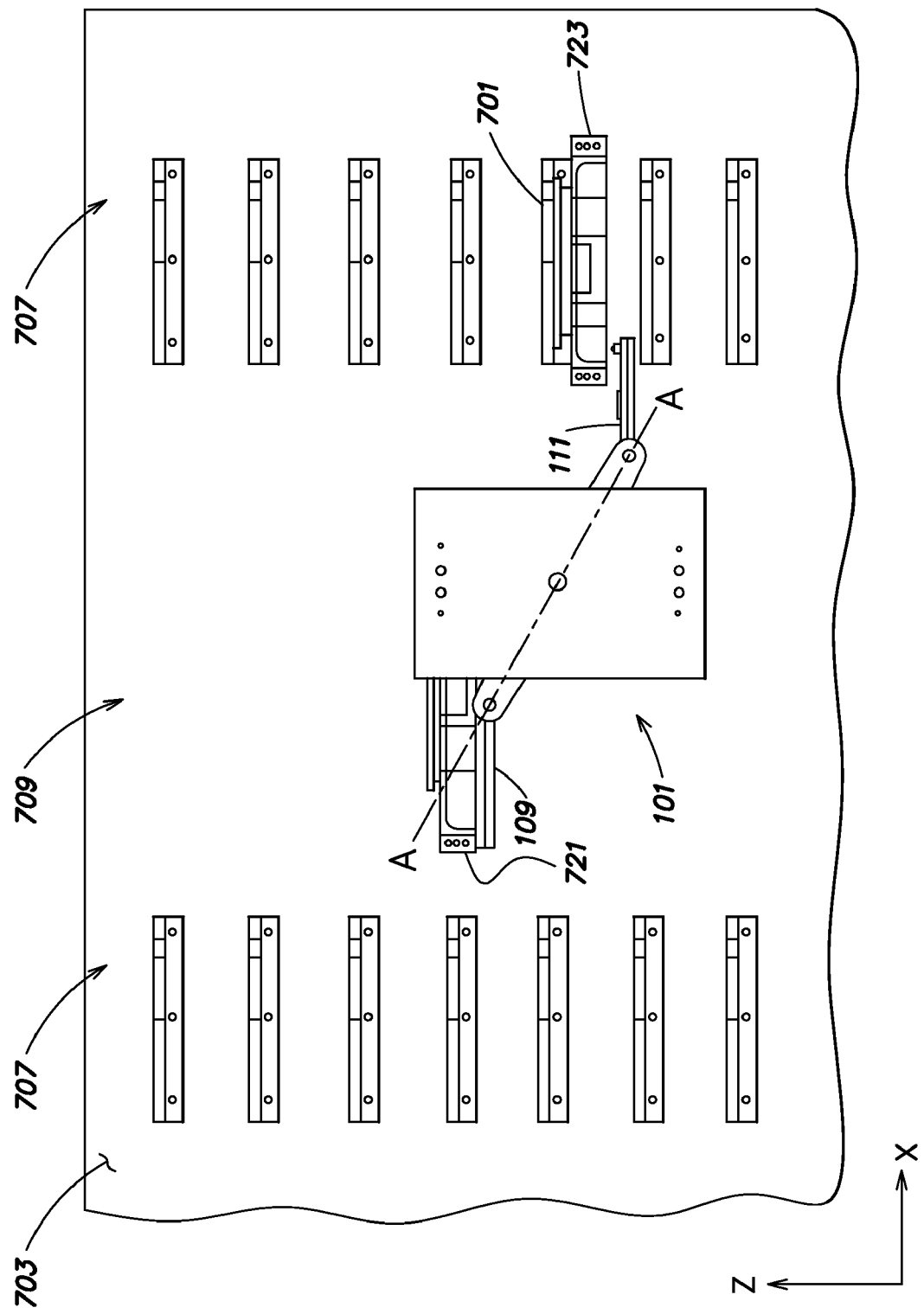
FIG. 18 is a block diagram of a second exemplary rear view of the end effector assembly as the robot positions the end effector assembly in the tunnel and rotates the end effector assembly to the third rotated arrangement in accordance with an embodiment of the present invention.

After placing the second substrate carrier 723 on the support location 701 in the manner described above, the robot may cause the end effector assembly 101 to rotate, move along the first axis (e.g., z-axis) and/or move along the second axis (e.g., x-axis) such that the end effector assembly 101 is properly positioned in the tunnel 709 (e.g., centered in the tunnel 709) between the substantially vertical columns 707 and rotated in the third rotated arrangement. For example, FIG. 17 is a block diagram of a first exemplary rear view of the end effector assembly 101 as the robot positions the end effector assembly 101 in the tunnel 709 and begins to rotate the end effector assembly 101 to the third rotated arrangement. With reference to FIG. 17, the robot may cause the end effector assembly 101 to move along the second axis (e.g., x-axis) such that the end effector assembly 101 begins to move out of the foot print of the support location 701. For example, the robot may begin to move the end effector assembly 101 towards a center of the tunnel 709. FIG. 18 is a block diagram of a second exemplary rear view of the end effector assembly 101 as the robot positions the end effector assembly 101 in the tunnel 709 and continues to rotate the end effector assembly 101 to the third rotated arrangement. With reference to FIG. 18, the robot may cause the end effector assembly 101 to rotate from the starting arrangement toward the third rotated arrangement. Further, the robot may cause the end effector assembly 101 to move along the first axis (e.g., z-axis) and continue to move along the second axis (e.g., x-axis). In this manner, the robot may continue to cause the end effector assembly 101 to move out of the foot print of the support location 701.

Figure 19:
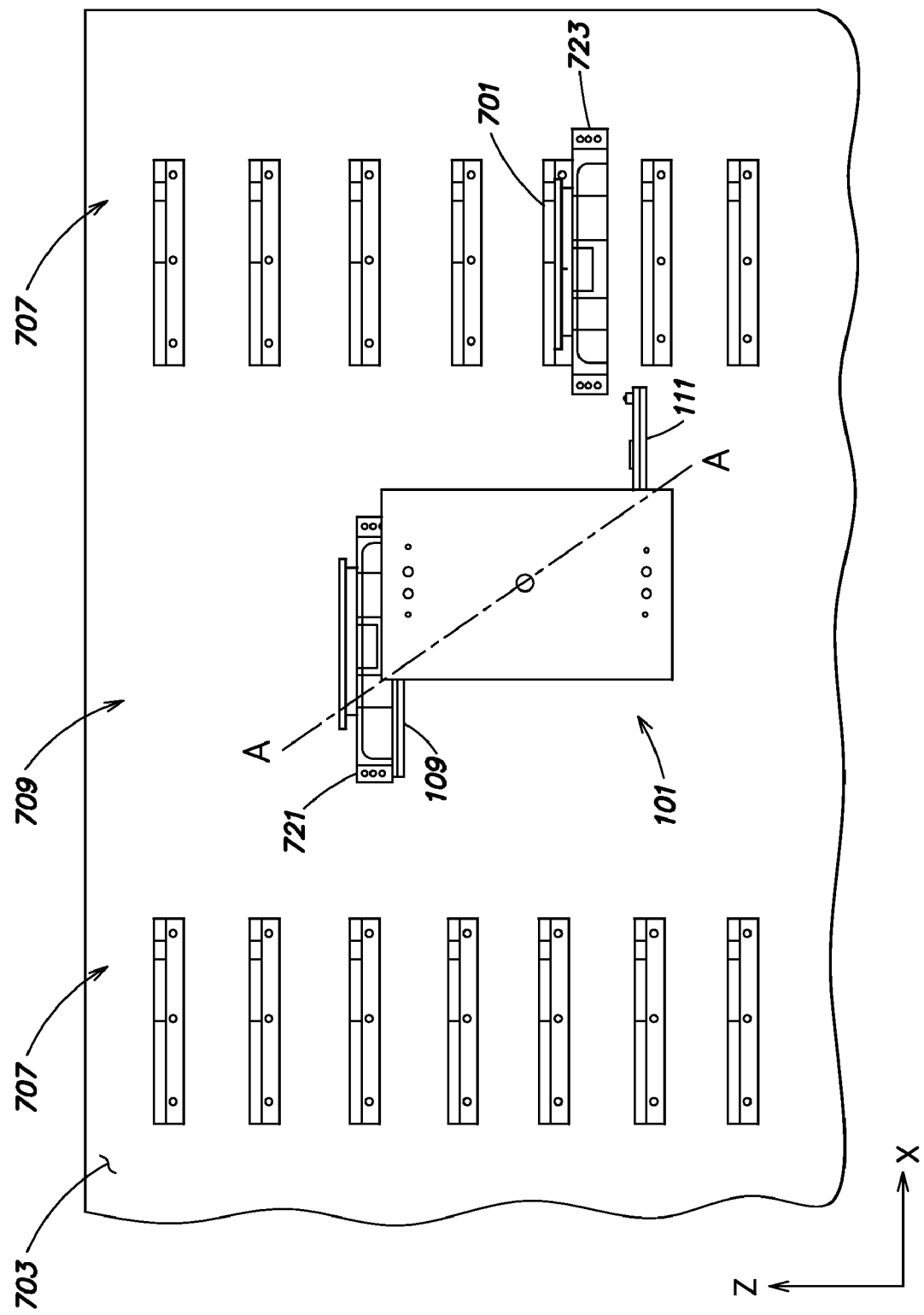
FIG. 19 is a block diagram of a third exemplary rear view of the end effector assembly as the robot positions the end effector assembly in the tunnel and rotates the end effector assembly to the third rotated arrangement in accordance with an embodiment of the present invention.

FIG. 19 is a block diagram of a third exemplary rear view of the end effector assembly 101 as the robot positions the end effector assembly 101 in the tunnel 709 and continues to rotate the end effector assembly 101 to the third rotated arrangement. With reference to FIG. 19, the robot may continue to cause the end effector assembly 101 to rotate from the starting arrangement toward the third rotated arrangement. Further, the robot may cause the end effector assembly 101 to continue to move along the first axis (e.g., z-axis). In this manner, the robot may move the end effector assembly 101 out of the foot print of the support location 701.

Figure 20:
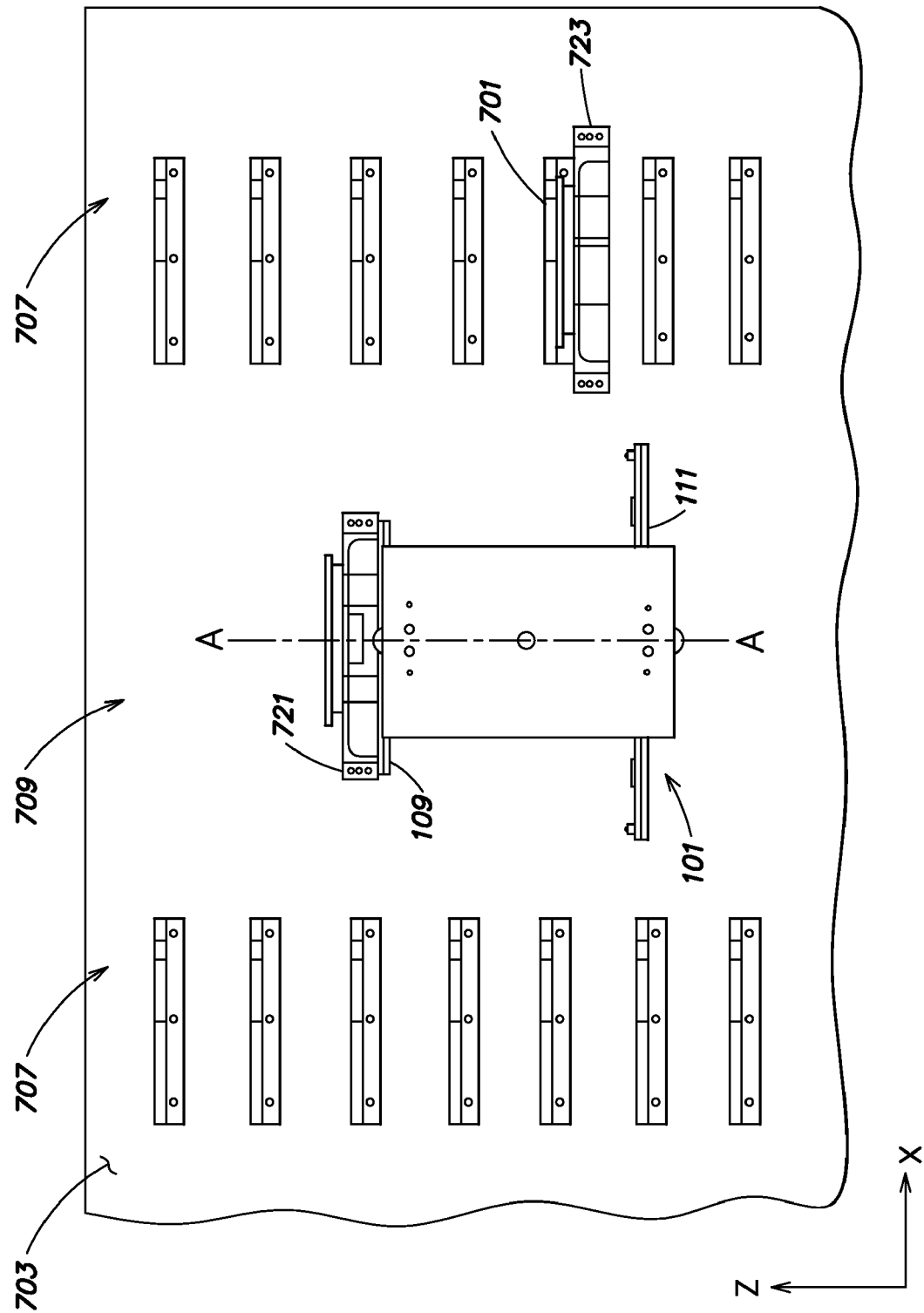
FIG. 20 is a block diagram of an exemplary rear view of the end effector assembly positioned in the tunnel and rotated to the third arrangement in accordance with an embodiment of the present invention.

FIG. 20 is a block diagram of an exemplary rear view of the end effector assembly 101 positioned in the tunnel 709 and rotated to the third rotated arrangement in accordance with an embodiment of the present invention. With reference to FIG. 20, the robot may continue to cause the end effector assembly 101 to rotate until the end effector assembly 101 is in the third rotated arrangement. Further, the robot may cause the end effector assembly 101 to continue to move along the first axis (e.g., z-axis) and move along the second axis (e.g., x-axis). In this manner, the robot may rotate and position the end effector assembly 101 in the tunnel 709 such that the end effector assembly may move along the first axis (e.g., z-axis) without contacting support locations 701 and/or substrate carriers (e.g., substrate carrier 723) coupled thereto.

In a similar manner to that employed to place the second substrate carrier 723 on the support location 701, the first substrate carrier 721 may be placed on another support location 701. More specifically, the robot may cause the end effector assembly 101 to rotate, move along the first axis (e.g., z-axis) and/or move along the second axis (e.g., x-axis) such that the first substrate carrier 721 is placed on another support location 701. In this manner, the end effector assembly 101 no longer supports any substrate carriers (e.g., is unloaded). Although the second substrate carrier 723 was placed on a support location 701 before the first substrate carrier 721, in some embodiments, the first substrate carrier 721 may be may be placed on a support location 701 before the second substrate carrier 723.

Thereafter, in the manner described above after placing the second substrate carrier 723 on the support location 701, the robot may rotate and properly position the end effector assembly 101 in the tunnel 709 such that the end effector assembly 101 (e.g., unloaded end effector assembly 101) may move along the first axis (e.g., z-axis) without contacting support locations 701 and/or substrate carriers coupled thereto. Further, the robot may cause the end effector assembly 101 to rotate, move along the first axis (e.g., z-axis) and/or move along the second axis (e.g., x-axis) such that the end effector assembly 101 returns to the starting location, thereby concluding the operational sequence.

Figures 21, 22:
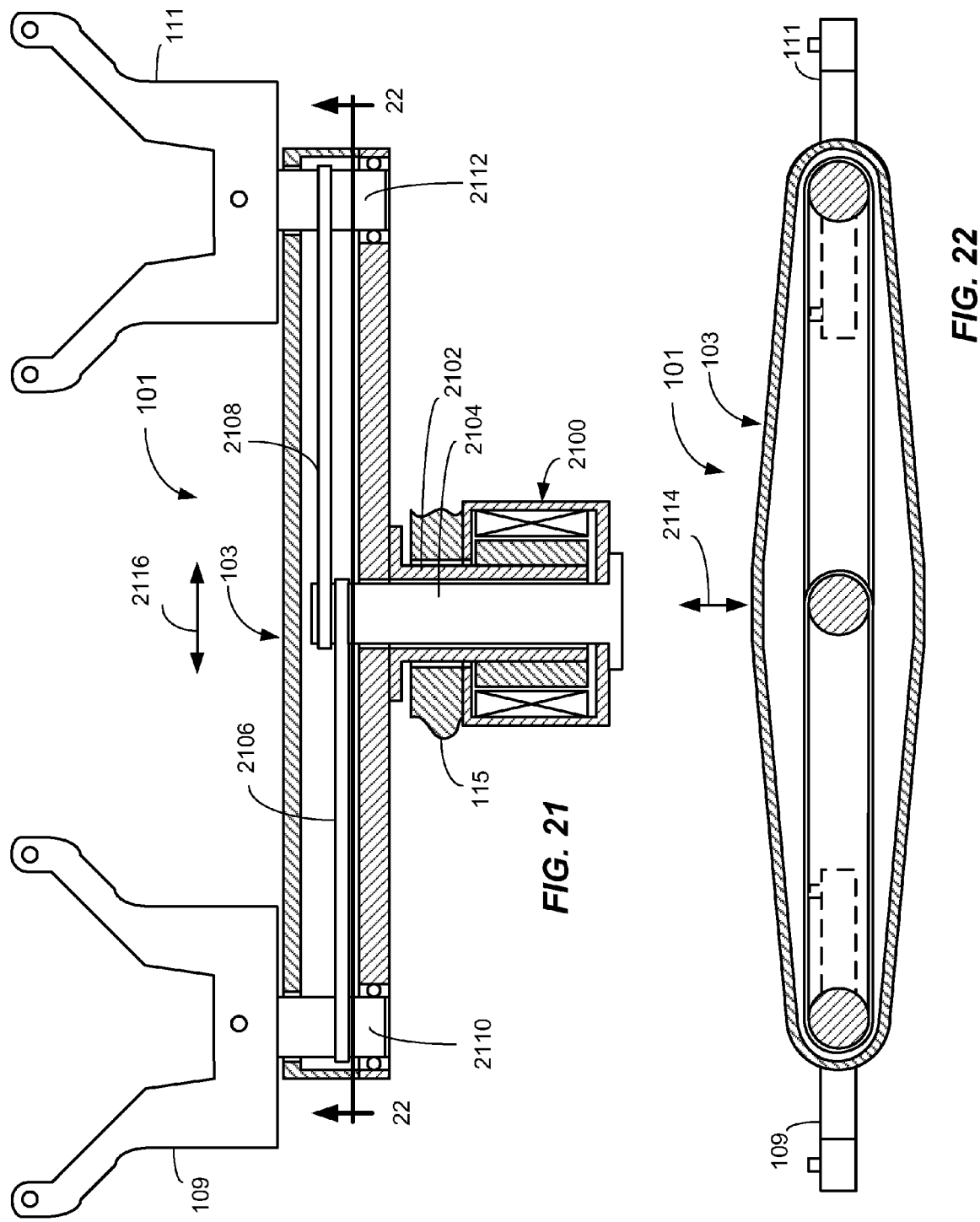
FIG. 21 is a partial cross-sectioned top view of an exemplary end effector assembly provided in accordance with an embodiment of the present invention.
FIG. 22 is a cross-sectioned rear view of the exemplary end effector assembly of FIG. 21 taken along section line 22-22.

FIGS. 21 and 22 illustrate an exemplary embodiment of the end effector assembly 101 depicting mechanisms adapted to cause rotation of the various components. In particular, the end effector assembly 101 may include a rotational motor 2100 which is adapted to cause rotation of the arm 103. Any suitable rotational motor may be used, such as a conventional variable reluctance or permanent magnet electric motor. Other types of motors may be used. A rotational shaft 2102 of the motor 2100 may be driven, for example, by an armature/magnet assembly of the motor 2100. The rotational shaft 2102 may be rigidly coupled to a center portion of the arm 103. Selectively energizing the motor 2100 may cause rotation of the arm 103 in a clockwise or counterclockwise direction, as commanded by a control system (not shown). The motor 2100 may be part of the robot assembly causing the motion of the assembly 101 and may be rigidly mounted to the back plate 115 (only a portion shown), for example. A false shaft 2104 may be fixedly and non-rotationally mounted to a body of the motor 2100 or to backing plate 115, such that it remains stationary relative to the backing plate 115. Rotation of the rotational shaft 2102 via energizing the motor 2100 causes rotation of the arm 103 and consequently produces relative rotation between the rotational shaft 2102 and the false shaft 2104.

Coupling members 2106, 2108 may rotationally couple the false shaft 2104 to end shafts 2110, 2112 positioned at the respective outer ends of the arm 103. The coupling members 2106, 2108 may be any suitable transmission element, such as a serpentine rubber belts (with or without belt cogs), a metal belts or straps, ropes, chains, gears, or a drive shaft system, etc. The first and second substrate carrier supports 109, 111 may be rigidly coupled to the end shafts 2110, 2112 which may be mounted for rotation in the arm 103 by suitable bearings or bushings. Accordingly, in operation, rotation of the rotational shaft 2102 causes a counter-directional relative rotation of the first and second substrate carrier supports 109, 111 relative to the arm 103 such that the first and second substrate carrier supports 109, 111 may retain a desired orientation (e.g., a horizontal attitude) at all times as the arm rotates 103. To accomplish the same rate of rotation of the first and second substrate carrier supports 109, 111 as the arm 103, gearing may be employed which accomplishes a 1:1 transmission ratio, such as by providing the same outside diameters for the end shafts 2110, 2112 and the false shaft 2104. A suitable transfer robot assembly, which is well known in the art, may cause the vertical and horizontal translational motions of the assembly 101 and backing plate 115 as indicated by arrows 2114, 2116, respectively. Other types of mechanisms for accomplishing the rotation of the arm 103 and the first and second substrate carrier supports 109, 111 may be employed.

Through use of the present methods and apparatus, a plurality of substrate carriers may be transferred from a continuously-moving conveyor 117 to respective support locations 701 during a single operational sequence. More specifically, the end effector assembly 101 may remove a first and second substrate carrier from the conveyor 117, transfer the first and second substrate carriers from the conveyor 117 to the support locations 701, and place the first and second substrate carriers onto respective support locations 701 during the operational sequence.

Although methods and apparatus for transferring a plurality of substrate carriers from a continuously-moving conveyor 117 to respective support locations 701 during a single operational sequence are described above in detail, it should be understood that the present invention also includes methods and apparatus for transferring a plurality of substrate carriers from respective support locations 701 to the continuously-moving conveyor 117 during a single operational sequence. Because the transfer of a plurality of substrate carriers from respective support locations 701 to the continuously-moving conveyor 117 is similar to the transfer of a plurality of substrate carriers from the continuously-moving conveyor 117 to respective support locations 701 performed in reverse, the operation of the end effector assembly 101 for transferring a plurality of substrate carriers from respective support locations 701 to the continuously-moving conveyor 117 during a single operational sequence are not describe in detail herein.

Therefore, in a broad aspect, the present invention includes methods and apparatus for (1) removing a first substrate carrier and second substrate carrier from respective support locations via an end effector assembly; and (2) concurrently transferring the first and second substrate carriers between the support locations and a moving conveyor via the end effector assembly. Further, the present methods and apparatus may place the first and second substrate carriers onto the moving conveyor. More specifically, the robot may cause the end effector assembly 101 to rotate, move along the first axis (e.g., z-axis) and/or move along the second axis (e.g., x-axis) in a manner similar to that described above such that (1) the end effector assembly 101 may move from the starting location to the support locations 701; (2) the first substrate carrier support 109 of the end effector assembly 101 may remove a first substrate carrier from a first support location and the second substrate carrier support 111 of the end effector assembly 101 may remove a second substrate carrier from a second support location; (3) the first and second substrate carriers are concurrently transferred from the support locations 701 to the conveyor 117; and (4) the first and/or second substrate carrier are displaced from the end effector assembly 101 onto the conveyor 117. Thereafter, the robot may cause the end effector assembly 101 to rotate, move along the first axis (e.g., z-axis) and/or move along the second axis (e.g., x-axis) such that the end effector assembly 101 returns to the starting location, thereby concluding the operational sequence.

Through use of the present methods and apparatus, a plurality of substrate carriers may be transferred (e.g., concurrently) between a moving conveyor 117 and respective storage locations 701 during a single operational sequence. Therefore, the present methods and apparatus may improve electronic device manufacturing (e.g., by increasing throughput) compared to electronic device manufacturing systems in which only a single substrate carrier may be transferred between a conveyor and a storage location during an operational sequence.

The foregoing description discloses only exemplary embodiments of the invention. Modifications of the above disclosed apparatus and methods which fall within the scope of the invention will be readily apparent to those of ordinary skill in the art. For instance, in some embodiments, when an error which causes the robot to stop functioning (e.g., power failure) is detected, the robot may cause the end effector assembly 101 to rotate to the starting arrangement or similar arrangement. Such rotation may be referred to as an "emergency duck down." In this manner, the end effector assembly 101 or a substrate carrier supported by the end effector assembly 101 may avoid interfering with the continuously-moving conveyor 117 (e.g., while the robot is not functioning). As described above, the present invention may be used to (1) remove a first substrate carrier and a second substrate carrier from a moving conveyor using an end effector assembly; and (2) concurrently transfer the first and second substrate carriers from the moving conveyor to a support location via the end effector assembly, and/or to (1) remove a first substrate carrier and second substrate carrier from respective support locations via the end effector assembly; and (2) concurrently transfer the first and second substrate carriers between the support locations and the moving conveyor via the end effector assembly. However, in other embodiments, the present invention may be used to (1) remove a single substrate carrier from the moving conveyor using the end effector assembly; and (2) transfer the substrate carrier from the moving conveyor to a support location via the end effector assembly, and/or to (1) remove a single substrate carrier from a support location via an end effector assembly; and (2) transfer the substrate carrier between the support location and the moving conveyor via the end effector assembly.

In some embodiments, when an end effector assembly 101, which is supporting a first substrate carrier and second substrate carrier, is rotated to the first arrangement such that central axis A of the arm 103 forms an angle of about 45° with the second axis (e.g., x-axis), the distance along the first axis (e.g., z-axis) from a center point 113 of the arm 103 to the top of the first substrate carrier (e.g., to the top of the overhead transfer flange 705 of the first substrate carrier) is about 8.84 in., and the distance along the first axis between the center point 113 of the arm 113 to the bottom of the second substrate carrier is about 5.21 in. Further, the distance along the second axis (e.g., x-axis) from the leftmost point of the second substrate carrier to the rightmost point of the first substrate carrier is about 25.24 in. The dimensions provided above are exemplary. Consequently, one or more of the dimensions may be larger or smaller.

Further, in such embodiments, when the end effector assembly 101, which is supporting a first and second substrate carrier, is rotated to the starting arrangement such that the central axis A of the arm 103 forms an angle of about 0° with the second axis (e.g., x-axis), the distance along the second axis from the leftmost point of the second substrate carrier to the rightmost point of the first substrate carrier is about 29.67 in (although a larger or smaller distance may be employed).

Additionally, in such embodiments, when the end effector assembly 101, which is supporting the first and second substrate carriers, is rotated to the third arrangement such that the central axis A of the arm 103 forms an angle of about 90° with the second axis, the distance along the second axis from the leftmost point of one of the substrate carrier supports 109, 111 to the rightmost point of that support 109, 111 is about 14.57 in. Further, the distance along the first axis (e.g., z-axis) from a top of the first substrate carrier (e.g., a top of the overhead transfer flange 705 of the first substrate carrier) to the bottom of the second substrate carrier is about 18.48 in. However, larger or smaller values may be employed for the dimensions above.

In some embodiments, the pitch (e.g., center-to-center distance) of substrate carriers supported by the end effector assembly 101 while in the starting arrangement substantially matches a pitch of adjacent substrate carriers on the moving conveyor 117. In such embodiments, the end effector assembly 101 may concurrently place two substrate carriers onto, or concurrently remove two substrate carriers from, the moving conveyor 117.

Accordingly, while the present invention has been disclosed in connection with exemplary embodiments thereof, it should be understood that other embodiments may fall within the spirit and scope of the invention, as defined by the following claims.

The invention claimed is:

1. A method of electronic device manufacturing, comprising:
    removing a first substrate carrier and a second substrate carrier from a moving conveyor using an end effector assembly, while the moving conveyor transports substrate carriers about an electronic device manufacturing facility; and
    concurrently transferring the first and second substrate carriers from the moving conveyor to a support location via the end effector assembly,
    wherein the end effector assembly includes an arm and a first rotatable substrate carrier support and a second rotatable substrate carrier support each coupled to the arm.

2. The method of claim 1 further comprising placing the first and second substrate carriers onto respective first and second support locations.

3. The method of claim 1 wherein:
    removing the first substrate carrier and the second substrate carrier from the moving conveyor using the end effector assembly includes removing the first substrate carrier from the moving conveyor using the first substrate carrier support and removing the second substrate carrier from the moving conveyor using the second substrate carrier support.

4. The method of claim 3 wherein:
    removing the first substrate carrier from the moving conveyor using the first substrate carrier support includes at least one of rotating the end effector assembly, moving the end effector assembly along a first axis and moving the end effector assembly along a second axis that is perpendicular to the first axis such that the first substrate carrier support removes the first substrate carrier from the moving conveyor; and
    removing the second substrate carrier from the moving conveyor using the second substrate carrier support includes at least one of rotating the end effector assembly, moving the end effector assembly along the first axis and moving the end effector assembly along the second axis such that the second substrate carrier support removes the second substrate carrier from the moving conveyor.

5. The method of claim 1 wherein:
    concurrently transferring the first substrate carrier and the second substrate carrier from the moving conveyor to a support location via the end effector assembly includes:
    rotating the end effector assembly such that the first substrate carrier support and the second substrate carrier support are substantially aligned along a first axis; and
    transferring the end effector assembly from the moving conveyor to the support location along the first axis.

6. The method of claim 5 further comprising:
transferring the end effector assembly along a second axis that is perpendicular to the first axis; and
while transferring the end effector assembly along the second axis, rotating the end effector assembly such that the first substrate carrier support and the second substrate carrier support are no longer substantially aligned along the first axis.

7. The method of claim 6 further comprising transferring the end effector assembly along the first axis such that the first substrate carrier is displaced from the first substrate carrier support onto the support location or the second substrate carrier is displaced from the second substrate carrier support onto the support location.

8. The method of claim 1 further comprising rotating the arm about a center point thereof.

9. The method of claim 8 further comprising rotating the arm relative to a horizontal axis.

10. The method of claim 8 further comprising rotating the first and second substrate carrier supports about points on the arm to which the first and second substrate carrier supports are coupled.

11. A method of electronic device manufacturing, comprising:
removing a first substrate carrier and a second substrate carrier from respective support locations via an end effector assembly, the end effector assembly including an arm and a first rotatable substrate carrier support and a second rotatable substrate carrier support each coupled to the arm; and
concurrently transferring the first substrate carrier and the second substrate carrier between the support locations and a moving conveyor via the end effector assembly, while the moving conveyor transports substrate carriers about an electronic device manufacturing facility.

12. The method of claim 11 further comprising placing the first second substrate carrier and second substrate carrier onto the moving conveyor.

13. The method of claim 11 wherein:
removing the first substrate carrier and the second substrate carrier from respective support locations using the end effector assembly includes removing the first substrate carrier from a first support location using the first substrate carrier support and removing the second substrate carrier from a second support location using the second substrate carrier support.

14. The method of claim 13 wherein:
removing the first substrate carrier from the first support location using the first substrate carrier support includes at least one of rotating the end effector assembly, moving the end effector assembly along a first axis and moving the end effector assembly along a second axis that is perpendicular to the first axis such that the first substrate carrier support removes the substrate carrier from the first support location; and
removing the second substrate carrier from the second support location using the second substrate carrier support includes at least one of rotating the end effector assembly, moving the end effector assembly along the first axis and moving the end effector assembly along the second axis such that the second substrate carrier support removes the substrate carrier from the second support location.

15. The method of claim 11 wherein:
concurrently transferring the first substrate carrier and second substrate carrier between the support locations and the moving conveyor using the end effector assembly includes:
rotating the end effector assembly such that the first substrate carrier support and the second substrate carrier support are substantially aligned along a first axis; and
transferring the end effector assembly between the plurality of support locations and the moving conveyor along the first axis.

16. The method of claim 15 further comprising:
transferring the end effector assembly along a second axis that is perpendicular to the first axis; and
while transferring the end effector assembly along the second axis, rotating the end effector assembly such that the first substrate carrier support and the second substrate carrier support are no longer substantially aligned along the first axis.

17. The method of claim 16 further comprising transferring the end effector assembly along the first axis such that the first substrate carrier is displaced from the first substrate carrier support onto the moving conveyor or the second substrate carrier is displaced from the second substrate carrier support onto the moving conveyor.

* * * * *